United States Patent
Park et al.

(10) Patent No.: US 9,953,997 B2
(45) Date of Patent: Apr. 24, 2018

(54) THREE-DIMENSIONAL SEMICONDUCTOR MEMORY DEVICES

(71) Applicants: Joyoung Park, Seoul Gyeonggi-do (KR); Hauk Han, Hwaseong-si (KR); Seok-Won Lee, Yongin-si (KR); Jeonggil Lee, Gyeonggi-do (KR); Jinwoo Park, Gunpo-si (KR); Kihyun Yoon, Hwaseong-si (KR); Hyunseok Lim, Suwon-si (KR); Jooyeon Ha, Suwon-si (KR)

(72) Inventors: Joyoung Park, Seoul Gyeonggi-do (KR); Hauk Han, Hwaseong-si (KR); Seok-Won Lee, Yongin-si (KR); Jeonggil Lee, Gyeonggi-do (KR); Jinwoo Park, Gunpo-si (KR); Kihyun Yoon, Hwaseong-si (KR); Hyunseok Lim, Suwon-si (KR); Jooyeon Ha, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 15/249,590

(22) Filed: Aug. 29, 2016

(65) Prior Publication Data

US 2017/0062472 A1  Mar. 2, 2017

(30) Foreign Application Priority Data

Sep. 2, 2015 (KR) .......................... 10-2015-0124266

(51) Int. Cl.
*H01L 23/52* (2006.01)
*H01L 27/11582* (2017.01)
(Continued)

(52) U.S. Cl.
CPC .. *H01L 27/11582* (2013.01); *H01L 21/76816* (2013.01); *H01L 21/76877* (2013.01);
(Continued)

(58) Field of Classification Search
None
See application file for complete search history.

(56) References Cited

U.S. PATENT DOCUMENTS

| 8,835,317 B2 | 9/2014 | Chandrashekar et al. |
| 2010/0144140 A1 | 6/2010 | Chandrashekar et al. |

(Continued)

FOREIGN PATENT DOCUMENTS

| KR | 20140143202 A | 12/2014 |
| KR | 10-2015-0013086 | 2/2015 |

*Primary Examiner* — Michael Lebentritt
(74) *Attorney, Agent, or Firm* — Myers Bigel, P.A.

(57) ABSTRACT

Disclosed is a semiconductor memory device including stacks on a substrate, a vertical channel portion connected to the substrate through each of the stacks, and a separation pattern disposed between the stacks. Each of the stacks may include a plurality of gate electrodes stacked on the substrate and insulating patterns interposed between the gate electrodes. Each of the gate electrodes may include a first metal pattern, which is disposed between the insulating patterns to define a recess region recessed toward the vertical channel portion, and a second metal pattern disposed in the recess region. The first and second metal patterns may contain the same metallic material and may have mean grain sizes different from each other.

20 Claims, 25 Drawing Sheets

(51) Int. Cl.
 *H01L 27/1157* (2017.01)
 *H01L 23/522* (2006.01)
 *H01L 23/528* (2006.01)
 *H01L 23/532* (2006.01)
 *H01L 21/768* (2006.01)

(52) U.S. Cl.
 CPC ........ *H01L 23/528* (2013.01); *H01L 23/5226* (2013.01); *H01L 23/53257* (2013.01); *H01L 27/1157* (2013.01)

(56) References Cited

U.S. PATENT DOCUMENTS

| | | |
|---|---|---|
| 2010/0314765 A1 | 12/2010 | Liang et al. |
| 2011/0073866 A1* | 3/2011 | Kim .................. H01L 27/11578 257/69 |
| 2014/0106083 A1 | 4/2014 | Wu et al. |
| 2014/0145137 A1* | 5/2014 | Ju ........................... H01L 45/08 257/2 |
| 2014/0349477 A1 | 11/2014 | Chandrashekar et al. |
| 2015/0050807 A1 | 2/2015 | Wu et al. |
| 2015/0056803 A1 | 2/2015 | Chandrashekar et al. |
| 2015/0194435 A1* | 7/2015 | Lee .................... H01L 27/11582 257/329 |
| 2016/0225786 A1* | 8/2016 | Lee .................... H01L 27/11582 |
| 2017/0033044 A1* | 2/2017 | Choi .................. H01L 27/11582 |
| 2017/0062471 A1* | 3/2017 | Son .................... H01L 27/11582 |
| 2017/0098656 A1* | 4/2017 | Son .................... H01L 27/11568 |
| 2017/0110543 A1* | 4/2017 | Shin .................... H01L 27/1157 |
| 2017/0125428 A1* | 5/2017 | Kanamori ......... H01L 27/11519 |
| 2017/0133400 A1* | 5/2017 | Yoo .................... H01L 27/11582 |
| 2017/0162578 A1* | 6/2017 | Noh .................... H01L 27/1052 |
| 2017/0194326 A1* | 7/2017 | Kim .................... H01L 23/5283 |
| 2017/0200736 A1* | 7/2017 | Park .................. H01L 27/11582 |
| 2017/0243886 A1* | 8/2017 | Lee .................... H01L 27/11582 |
| 2017/0256558 A1* | 9/2017 | Zhang ................ H01L 23/5226 |
| 2017/0271463 A1* | 9/2017 | Lim .................... H01L 23/485 |
| 2017/0287928 A1* | 10/2017 | Kanamori ............. G11C 5/063 |
| 2017/0287930 A1* | 10/2017 | Lee .................... H01L 27/11582 |
| 2017/0294445 A1* | 10/2017 | Son .................... H01L 27/11565 |
| 2017/0301689 A1* | 10/2017 | Choi .................. H01L 27/11582 |

* cited by examiner

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2015-0124266, filed on Sep. 2, 2015 in the Korean Intellectual Property Office, the entire contents of which are incorporated herein by reference.

BACKGROUND

The present disclosure relates to semiconductor memory devices and, in particular, to three-dimensional semiconductor memory devices that have high reliability.

Higher integration of semiconductor devices is often required to satisfy consumer demands for superior performance and inexpensive prices. The integration density of two-dimensional (2D) or planar semiconductor devices is mainly determined by the area occupied by a unit memory cell. As such, in these devices, integration is heavily influenced by how finely patterns can be formed in the device. As extremely expensive process equipment is typically required to generate increasingly fine patterns, a practical limit exists with respect to increasing the integration density of two-dimensional semiconductor devices.

To overcome such a limitation, three-dimensional (3D) semiconductor memory devices that include three-dimensionally-arranged memory cells have been proposed. However, there are significant manufacturing obstacles in achieving low-cost, mass-production of 3D semiconductor memory devices, particularly in the mass-fabrication of 3D devices that maintain or exceed the operational reliability of their 2D counterparts.

SUMMARY

Some embodiments of the inventive concepts provide three-dimensional semiconductor memory devices that have high reliability.

Some embodiments of the inventive concepts provide methods of fabricating three-dimensional semiconductor memory devices that have high reliability.

According to some embodiments of the inventive concepts, a semiconductor memory device may include stacks on a substrate, each of the stacks including a plurality of gate electrodes stacked on the substrate and insulating patterns interposed between the gate electrodes, a vertical channel connected to the substrate, and a separation pattern disposed between the stacks. Each of the gate electrodes may include a first metal pattern disposed between the insulating patterns to define a recess region recessed toward the vertical channel and a second metal pattern disposed in the recess region. The first and second metal patterns may contain the same metallic material and may have mean grain sizes different from each other.

In some embodiments, a first mean grain size of the metallic material in the first metal patterns may be greater than a second mean grain size of the metallic material in the second metal patterns.

In some embodiments, a first of the second metal patterns may have a first vertical thickness at a region that is adjacent the vertical channel and a second vertical thickness at another region that is adjacent the separation pattern, and the first vertical thickness may be substantially the same as the second vertical thickness.

In some embodiments, a first of the second metal patterns may have a first vertical thickness at a region that is adjacent the vertical channel and a second vertical thickness at another region that is adjacent the separation pattern, and the second vertical thickness may be greater than the first vertical thickness.

In some embodiments, the second vertical thickness of the first of the second metal patterns may be smaller than a vertical thickness of a first of the gate electrodes.

In some embodiments, the second vertical thickness of the first of the second metal patterns may be substantially the same as a vertical thickness of the first of the gate electrodes.

In some embodiments, a first of the second metal patterns may have a vertical thickness that decreases in a direction from the separation pattern toward the vertical channel.

In some embodiments, the semiconductor memory device may further include an insulating layer which is disposed between the vertical channel and each of the first metal patterns and which covers top and bottom surfaces of the respective first metal patterns. The second metal patterns may be disposed the separation pattern and the respective first metal patterns and may contact the insulating layer.

In some embodiments, a portion of a first of the second metal patterns that is adjacent the separation pattern may have a vertical length that decreases in a direction from the separation pattern toward the vertical channel, and another portion of the first of the second metal patterns that is adjacent the vertical channel may have a substantially uniform vertical length.

In some embodiments, each of the first and second metal patterns may contain tungsten.

According to some embodiments of the inventive concepts, a semiconductor memory device may include stacks on a substrate, each of the stacks including a plurality of gate electrodes stacked on the substrate and insulating patterns interposed between the gate electrodes, a vertical channel connected to the substrate, and a separation pattern disposed between the stacks. Each of the gate electrodes may include a first metal pattern, which is disposed between the insulating patterns to define a recess region recessed toward the vertical channel, and a second metal pattern, which is disposed in the recess region. Here, the second metal pattern may have a first vertical thickness at a region that is adjacent the vertical channel and a second vertical thickness at another region that is adjacent the separation pattern. The second vertical thickness may be greater than the first vertical thickness.

In some embodiments, the second metal pattern may have a vertical thickness that decreases in a direction from the separation pattern toward the vertical channel.

In some embodiments, the second vertical thickness of a first of the second metal patterns may be substantially the same as a vertical thickness of a first of the gate electrodes.

In some embodiments, the second vertical thickness of a first of the second metal patterns may be smaller than a vertical thickness of a first of the gate electrodes.

In some embodiments, the first and second metal patterns may contain the same metal material, and the first metal patterns may have a first mean grain size that is larger than a second mean grain size of the second metal patterns.

According to some embodiments of the inventive concepts, a semiconductor memory device may include a plurality of gate electrodes that are vertically stacked on a substrate, each gate electrode including a first metal pattern and a second metal pattern that fills a recess region defined by the first metal pattern. The first and second metal patterns comprise the same material but have different mean grain sizes.

In some embodiments, the semiconductor memory device may further include an insulating layer, a separation pattern and a vertical channel, where the gate electrodes are disposed between the separation pattern and the vertical channel, the insulating layer is between each gate electrode and the vertical channel, and the insulating layer further covers top and bottom surfaces of each of the gate electrodes.

In some embodiments, the portions of the second metal patterns that are adjacent the vertical channel may have a first vertical thickness and portions of the second metal patterns that are adjacent the spacer may have a second vertical thickness, the second vertical thickness being greater than the first vertical thickness.

In some embodiments, each first metal pattern may be generally U-shaped and each second metal pattern may fill an interior of the respective one of the generally U-shaped first metal patterns.

In some embodiments, the spacer may directly contact each first metal pattern and each second metal pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
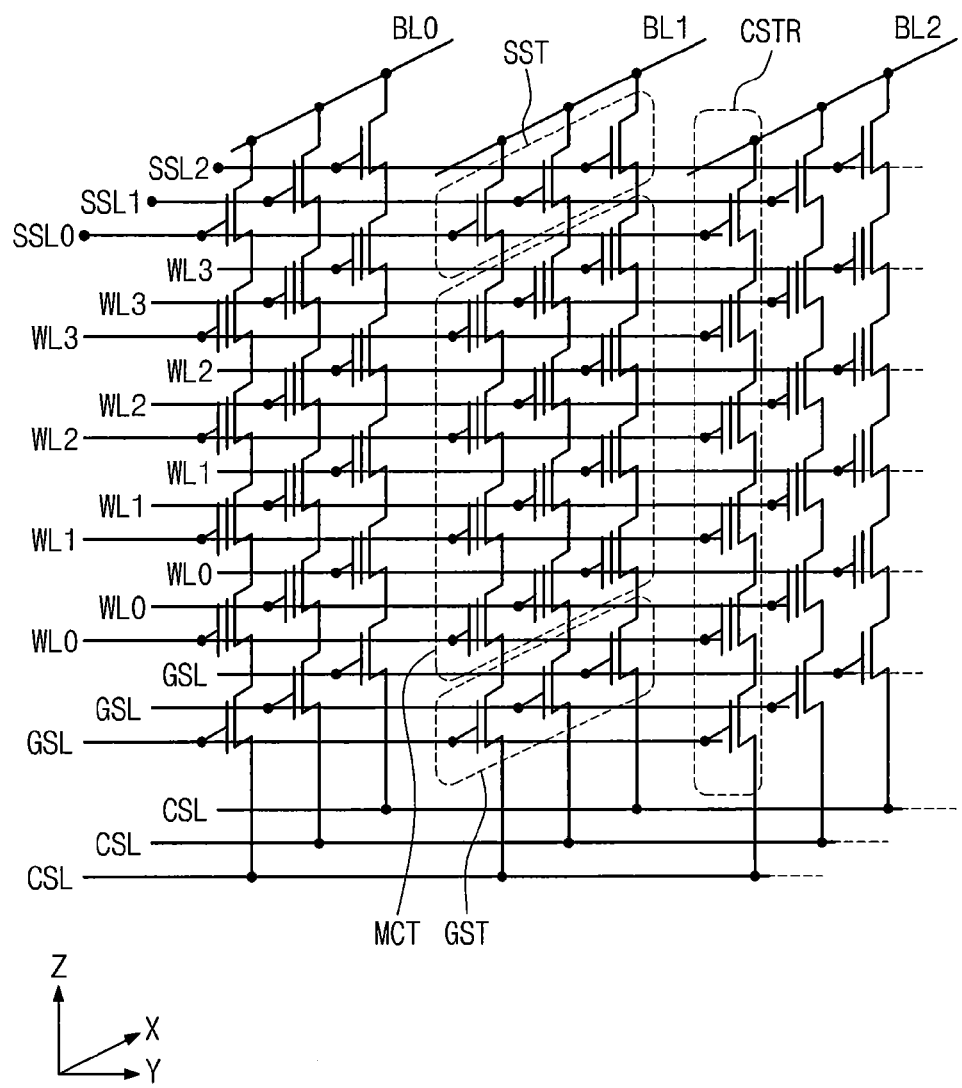
FIG. 1 is a schematic circuit diagram illustrating a cell array of a semiconductor memory device according to some embodiments of the inventive concepts.

It should be noted that these figures are intended to illustrate the general characteristics of methods, structure and/or materials utilized in certain example embodiments and to supplement the written description provided below. These drawings are not necessarily to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity.

DETAILED DESCRIPTION

Example embodiments of the inventive concepts will now be described more fully with reference to the accompanying drawings. The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," when used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram illustrating a cell array of a semiconductor memory device according to some embodiments of the inventive concepts.

The semiconductor memory device of FIG. 1 includes a common source line CSL, a plurality of bit lines BL0-BL2, and a plurality of cell strings CSTR that are disposed between the common source line CSL and the bit lines BL0-BL2.

The bit lines BL0-BL2 may be two-dimensionally arranged on the substrate, and respective pluralities of the cell strings CSTR may be connected in parallel to each of the bit lines BL0-BL2. Accordingly, the cell strings CSTR may also be two-dimensionally arranged on the common source line CSL or the substrate.

Each of the cell strings CSTR may include a ground selection transistor GST that is connected to the common source line CSL, a string selection transistor SST that is connected to one of the bit lines BL0-BL2, and a plurality of memory cell transistors MCT that are disposed between ground and string selection transistors GST and SST. The ground selection transistor GST, the memory cell transistors MCT, and the string selection transistor SST constituting each of the cell strings CSTR may be connected in series. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The gate electrodes of the ground selection transistors GST may be connected in common to the ground selection line GSL, thereby being in an equipotential state. Similarly, the gate electrodes of the memory cell transistors MCT that are located at the same vertical level of the device may also be connected in common to one of the word lines WL0-WL3, thereby being in an equipotential state. Since each of the cell strings CSTR includes a plurality of the memory cell transistors MCT disposed at different levels from each other, the word lines WL0-WL3 may have a multi-layered structure, between the common source line CSL and the bit lines BL0-BL2.

The ground and string selection transistors GST and SST and the memory cell transistors MCT may be metal-oxide-semiconductor field effect transistors (MOSFETs), in which the channel structures are used as channel regions. In certain embodiments, the channel structure, in conjunction with the ground selection line GSL, the word lines WL0-WL3, and the string selection lines SSL, may constitute metal-oxide-semiconductor (MOS) capacitors. In this case, if a voltage higher than a threshold voltage of the MOS capacitor is applied to the ground selection line GSL, the word lines WL0-WL3, and the string selection lines SSL, a fringe field may be produced to form an inversion layer between the word lines WL0-WL3, and the formation of such an inversion layer may allow the ground selection transistor GST, the memory cell transistors MCT, and the string selection transistor SST to be electrically connected to each other.

Figure 2:
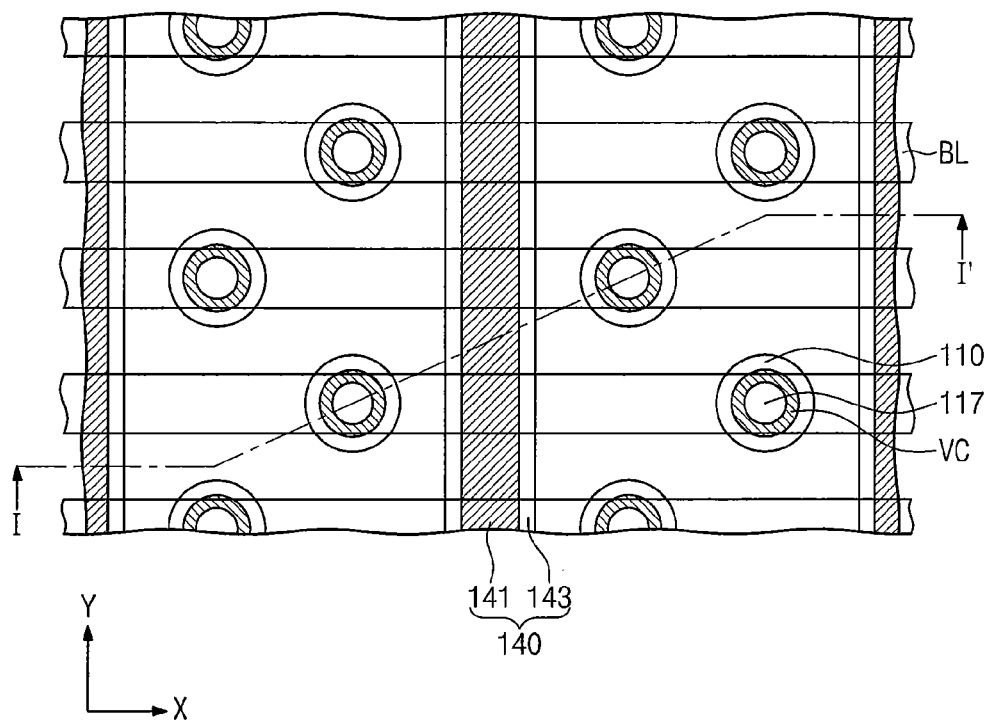
FIG. 2 is a plan view illustrating a semiconductor memory devices according to some embodiments of the inventive concepts.
Figure 3:
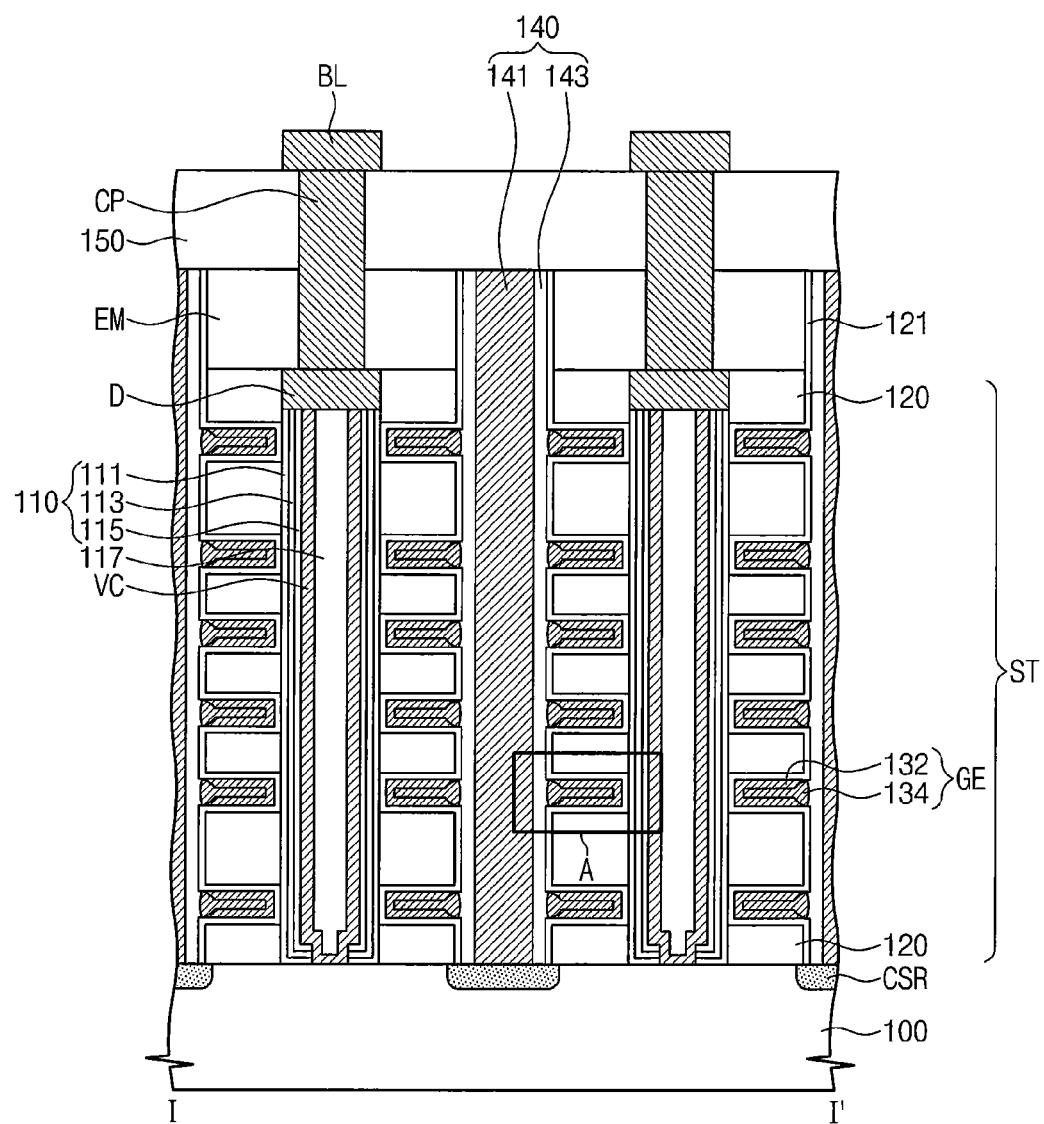
FIG. 3 is a sectional view, which is taken along line I-I' of FIG. 2, that illustrates a semiconductor memory device according to some embodiments of the inventive concepts.
Figure 4:
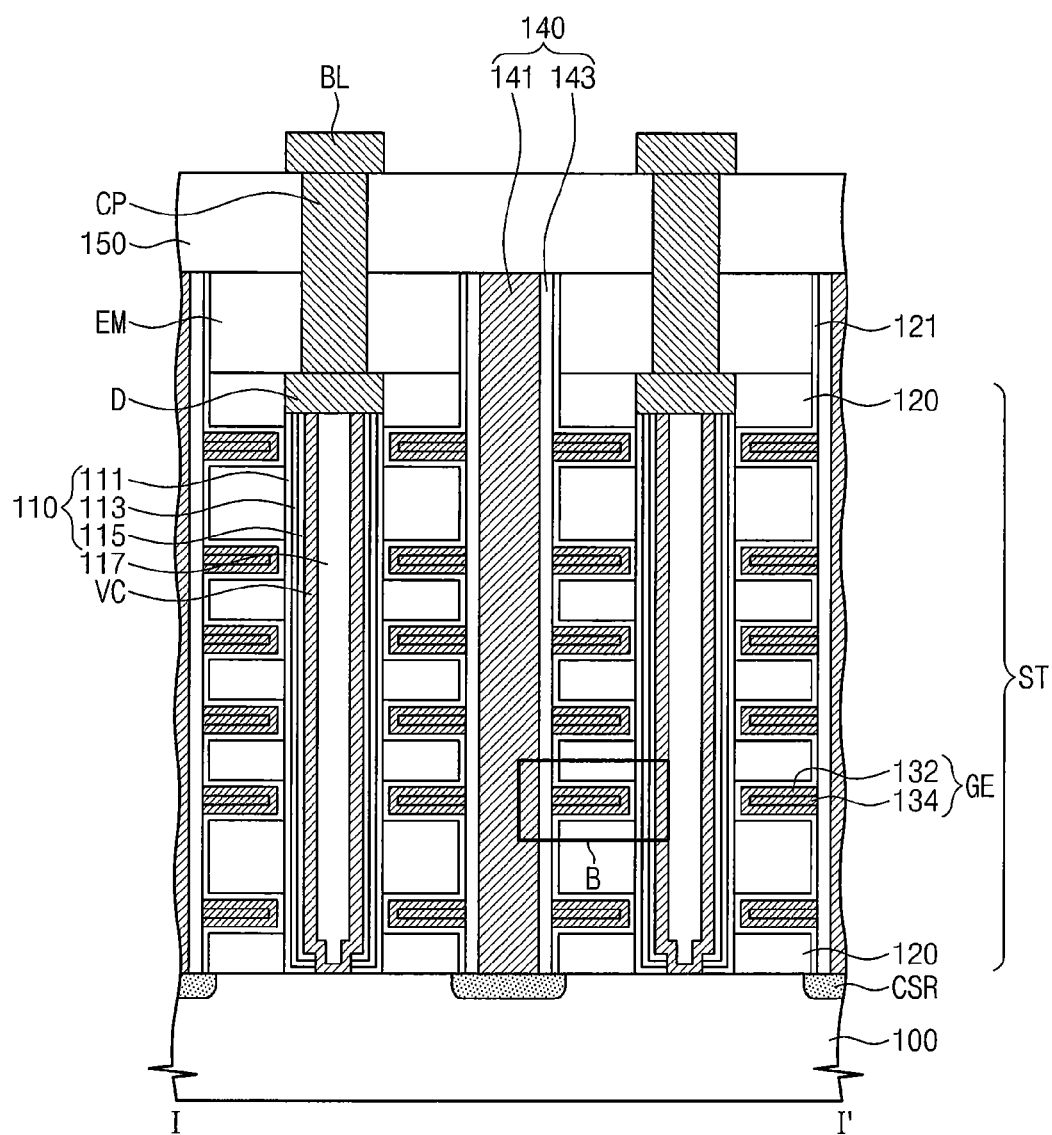
FIG. 4 is a sectional view, which is taken along line I-I' of FIG. 2, that illustrates a semiconductor memory device according to other embodiments of the inventive concepts.
Figure 5:
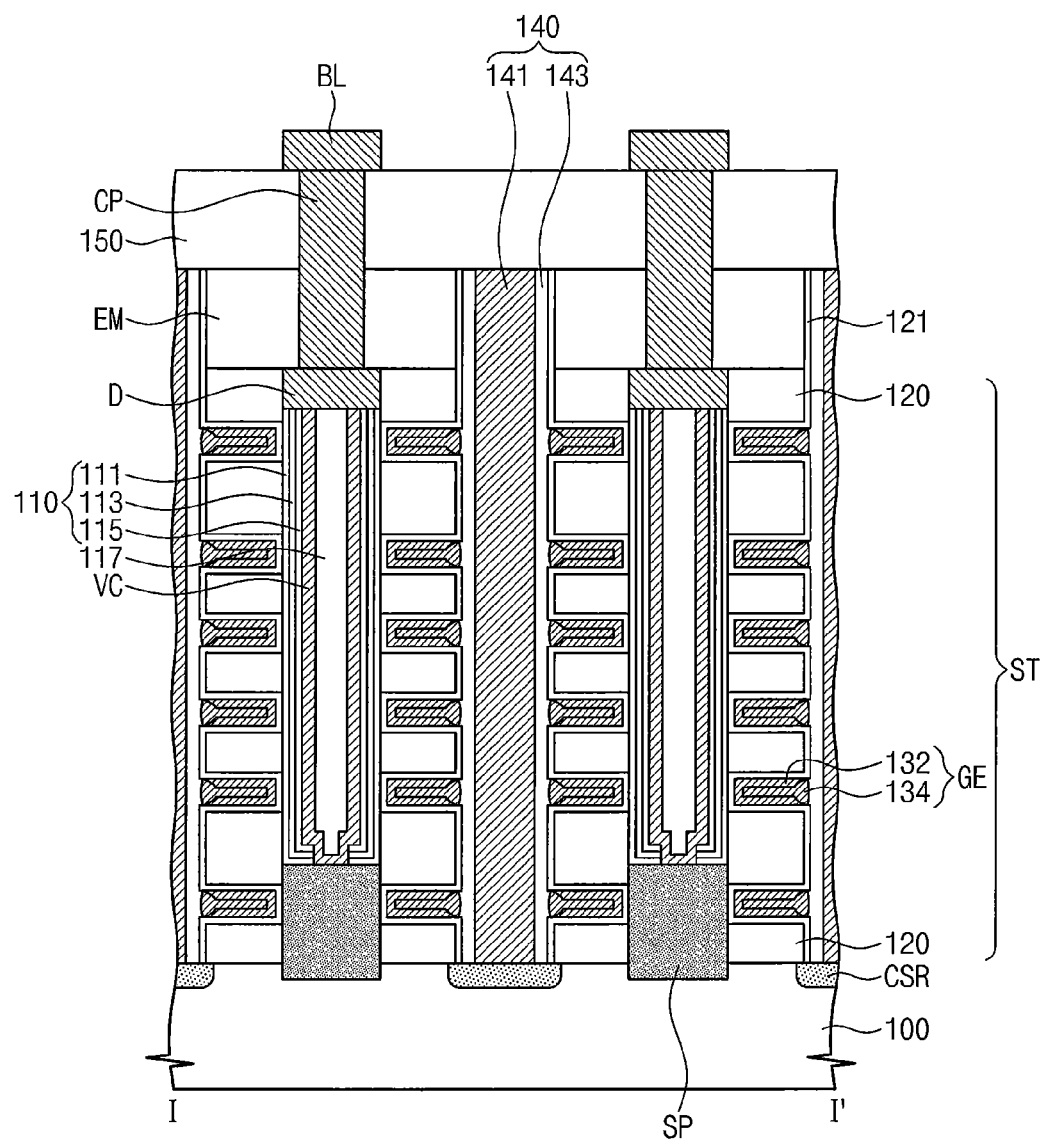
FIG. 5 is a sectional view, which is taken along line I-I' of FIG. 2, that illustrates a semiconductor memory device according to still further some embodiments of the inventive concepts.

FIG. 2 is a plan view of semiconductor memory devices according to some embodiments of the inventive concepts. FIGS. 3 through 5 are sectional views, each of which is taken along line I-I' of FIG. 2, that illustrate semiconductor memory devices according to several different embodiments of the inventive concepts.

Referring to FIGS. 2 through 5, a plurality of stacks ST may be provided on a substrate 100. An upper surface of the substrate 100 may extend in a first direction X and a second direction Y that is perpendicular to the first direction X. The stacks ST may extend on the substrate 100 in the second direction Y and may be spaced apart from each other in the first direction X. The substrate 100 may be, for example, a silicon substrate, a silicon-germanium substrate, a germanium substrate, or a single-crystalline epitaxial layer grown on a single-crystalline silicon substrate. At least one impurity region CSR may be provided in the substrate 100 and between two adjacent stacks ST. The impurity region CSR may extend in the second direction Y. The impurity region CSR may serve as the common source line of FIG. 1. The impurity region CSR may have a conductivity type different from that of the substrate 100.

Each of the stacks ST may include insulating patterns 120, which are vertically stacked on a top surface of the substrate 100, and gate electrodes GE, which are interposed between the insulating patterns 120. For example, the insulating patterns 120 and the gate electrodes GE may be alternately and repeatedly stacked on the substrate 100. The gate electrodes GE may serve as gate lines of some transistors constituting the semiconductor memory device. For example, the gate electrodes GE may serve as the ground selection line GSL, the word lines WL, and the string selection line SSL of FIG. 1, according to their stacking order on the substrate 100. The gate electrodes GE will be described in more detail below.

Thicknesses of the insulating patterns 120 may be variously changed, depending on technical features required for the semiconductor memory device. For example, the insulating pattern 120 disposed between the lowermost and next-lowermost ones of the gate electrodes GE and between the uppermost and next-uppermost ones of the gate electrodes GE may be thicker than the other insulating patterns 120. The insulating patterns 120 may be formed of or include, for example, silicon oxide.

Vertical channel portions VC, also referred to herein as vertical channels VC, may penetrate through the stacks ST to connect to the substrate 100. When viewed in a plan view (see FIG. 2), the vertical channels VC may form a linear or zigzag arrangement in the first direction X and/or in the second direction Y. The vertical channels VC may have bottom surfaces that are in direct contact with the top surface of the substrate 100. Each of the vertical channels VC may extend in a direction normal to the top surface of the substrate 100, thereby vertically crossing a plurality of gate electrodes GE. Each of the vertical channels VC may have, for example, a hollow pipe shape, a hollow cylindrical shape, or a cup shape. The vertical channels VC may include a semiconductor material. For example, the vertical channels VC may be formed of one of a polysilicon layer, an organic semiconductor layer, or carbon nano structures. Herein when a layer or element is said to "include" a material it my be formed exclusively of the material or may include the material and one or more other materials.

A capping layer 117 may be provided in the interior of each of the vertical channels VC. The capping layer 117 may include at least one insulating material (e.g., silicon oxide, silicon nitride, or silicon oxynitride).

A pad D may be provided on each of the vertical channels VC to cover the capping layer 117. Each pad D may be electrically connected to a respective one of the vertical channels VC. The pad D may include a conductive material (e.g., a metal, a conductive metal oxide or a doped semiconductor material). If the conductive material is a doped semiconductor material, the doped semiconductor material may have a conductivity type that is different from the conductivity type of the vertical channels VC.

Referring to FIG. 5, semiconductor pillars SP may be provided below the respective vertical channels VC to be in contact with the substrate 100 in some embodiments. The semiconductor pillars SP may be adjacent the lowermost one of the gate electrodes GE that serves as the ground selection line. The semiconductor pillars SP may be formed of a doped semiconductor material, which has the same conductivity type as the substrate 100, or an intrinsic semiconductor material. The semiconductor pillars SP may include, for example, a single-crystalline intrinsic semiconductor material or a single-crystalline p-type semiconductor material in some embodiments.

A charge storing structure 110 may be disposed between each vertical channel VC and the stack ST that is adjacent thereto. Each charge storing structure 110 may enclose at least a portion of an outer sidewall of a respective one of the vertical channels VC. The charge storing structure 110 may include a blocking insulating layer 111, a charge storing layer 113, and a tunnel insulating layer 115. The blocking insulating layer 111 may be between the vertical channel VC and the stack ST, and the tunnel insulating layer 115 may be between the blocking insulating layer 111 and the vertical channel VC. In other words, the blocking insulating layer 111 may be adjacent the stack ST, and the tunnel insulating layer 115 may be adjacent the vertical channel VC. The charge storing layer 113 may be between the blocking insulating layer 111 and the tunnel insulating layer 115.

The charge storing structure 110 may include at least one of a silicon oxide layer, a silicon nitride layer, or a silicon oxynitride layer. In some embodiments, the blocking insulating layer 111 may be at least one of a silicon oxide layer or high-k dielectric layers (e.g., aluminum oxide ($Al_2O_3$) or hafnium oxide ($HfO_2$)), the charge storing layer 113 may be a silicon nitride layer, and the tunnel insulating layer 115 may be at least one of a silicon oxide layer or high-k dielectric layers (e.g., aluminum oxide ($Al2O_3$) or hafnium oxide ($HfO_2$)).

A separation pattern 140 may be disposed between adjacent stacks ST. The separation pattern 140 may contact the top surface of the substrate 100 and an outer sidewall of each of the stacks ST and may be vertically extended to have a portion that is positioned between mask patterns EM. The separation pattern 140 may extend along the impurity region CSR in the second direction Y. For example, when viewed in a plan view, the separation pattern 140 may be shaped like a rectangle or line that is elongated in the second direction Y.

The separation pattern 140 may include a common source contact 141 and spacers 143. The common source contact 141 may electrically connect to the impurity region CSR provided in the substrate 100. The common source contact 141 may include at least one of metals (e.g., tungsten, copper, or aluminum) or transition metals (e.g., titanium or tantalum). The spacers 143 may be disposed between the common source contact 141 and the respective stacks ST. The spacers 143 may electrically insulate the common source contact 141 from the gate electrodes GE. Each spacer 143 may comprise at least one insulating material (e.g., silicon oxide or silicon nitride).

Figure 6:
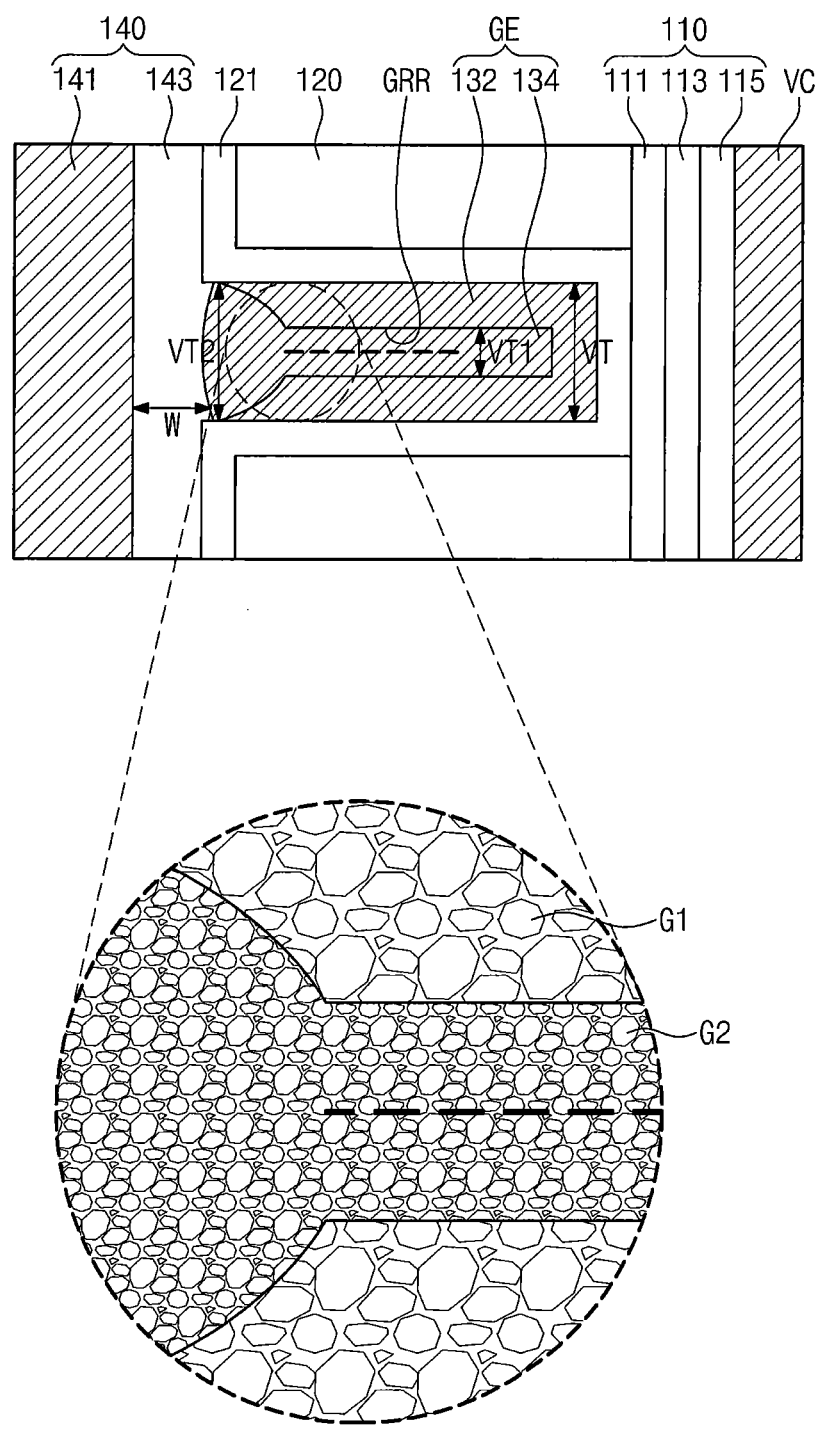
FIGS. 6 through 7 are enlarged views of a portion 'A' of FIG. 3.
Figure 7:
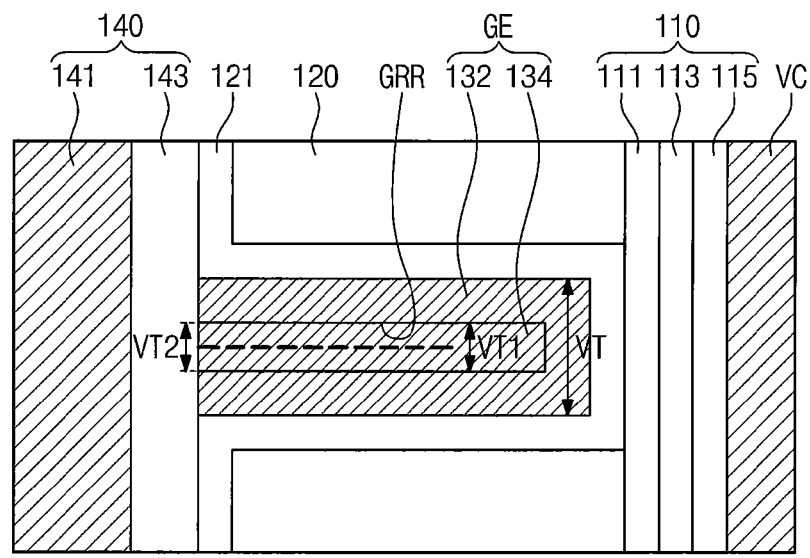
Figure 8:
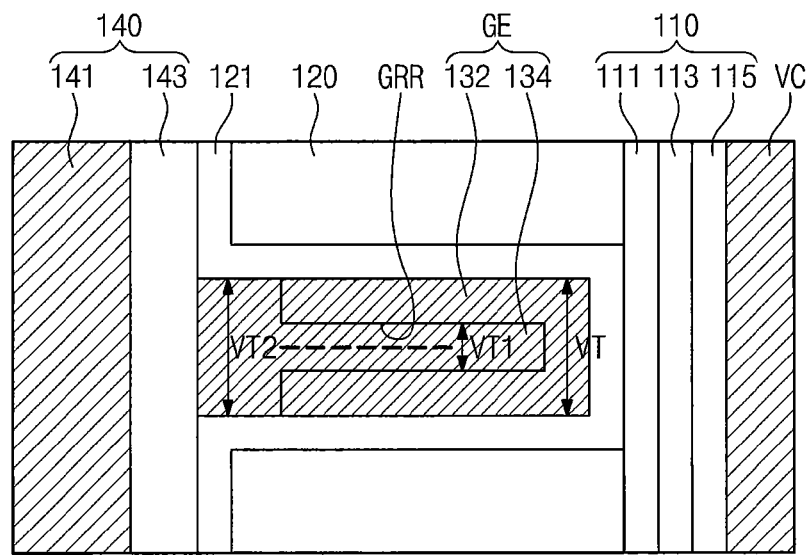
FIGS. 8 and 9 are enlarged views of a portion 'B' of FIG. 4.
Figure 9:
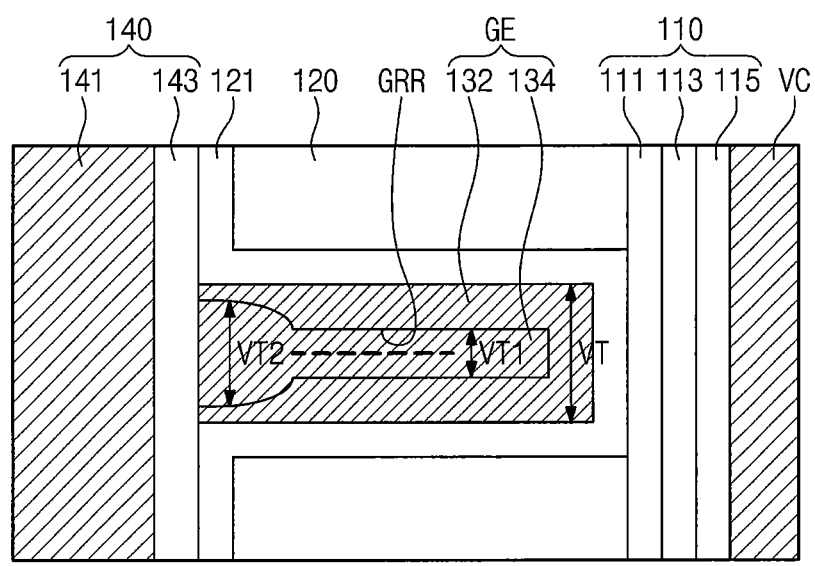

An insulating layer 121 may be disposed between the charge storing structure 110 and the gate electrodes GE and may extend to cover top and bottom surfaces of the gate electrodes GE. As shown in FIG. 6, in some embodiments, a portion of the spacer 143 that contacts the gate electrodes GE may have a horizontal width "W" that is larger than that of another portion of the spacer 143 that is adjacent the insulating layer 121. In other embodiments, the spacer 143 may have a uniform width, as shown in FIGS. 7 through 9. The insulating layer 121 may be used as a part of a blocking insulating layer of a charge-trapping-type nonvolatile memory transistor. The insulating layer 121 may include a silicon oxide layer (e.g., $SiO_2$) or a high-k dielectric layer (e.g., aluminum oxide ($Al_2O_3$) or hafnium oxide ($HfO_2$)).

The mask patterns EM may be provided on top of the stacks ST. The mask patterns EM may cover portions of the pads D. The mask patterns EM may include, for example, a silicon oxide layer or a silicon nitride layer.

An interlayer insulating layer 150 may be provided on the mask patterns EM. The interlayer insulating layer 150 may cover the separation pattern 140. The interlayer insulating layer 150 may comprise an insulating material (e.g., silicon oxide, silicon nitride, or silicon oxynitride).

Contact plugs CP may penetrate through the interlayer insulating layer 150 and the mask patterns EM to electrically connect to the respective pads D. The contact plug CP may include at least one of doped silicon or metal materials (e.g., tungsten (W), copper (Cu), or aluminum (Al)).

Bit lines BL may be provided on the interlayer insulating layer 150. Each of the bit lines BL may cross the stacks ST and may be electrically connected to a plurality of the vertical channels VC that are arranged in the first direction X. The bit lines BL may comprise at least one of conductive materials (e.g., tungsten (W)).

FIGS. 6 through 7 are enlarged views of a portion 'A' of FIG. 3 and FIGS. 8 and 9 are enlarged views of a portion 'B' of FIG. 4. Hereinafter, some examples of possible structures for the gate electrodes GE according to various embodiments of the inventive concepts will be described in more detail with respect to FIGS. 6 through 9.

Referring to FIGS. 6 through 9, each of the gate electrodes GE may include a first metal pattern 132 and a second metal pattern 134. The first metal pattern 132 may be disposed between a pair of the insulating patterns 120 that are adjacent each other in the vertical direction, and may define an electrode recess region GRR that is laterally recessed toward the vertical channel VC. The second metal pattern 134 may also be disposed in the electrode recess region GRR. For example, the second metal pattern 134 may be interposed between the first metal pattern 132 and the spacer 143. The first and second metal patterns 132 and 134 may comprise the same metallic material (e.g., tungsten). The first metal pattern 132 may have a mean grain size different from that of the second metal pattern 134. For example, as shown in FIG. 6, the first metal pattern 132 may have a mean grain size G1 that is larger than a mean grain size G2 of the second metal pattern 134 (i.e., G1>G2).

The gate electrodes GE may have a vertical thickness of VT. A first portion of the second metal pattern 134 that is adjacent the vertical channel VC may have a first vertical thickness VT1 and a second portion of the second metal pattern 134 that is adjacent the separation pattern 140 may have a vertical thickness VT2, where the second vertical thickness VT2 may be larger than the vertical thickness VT1 in some embodiments. The shape of the second metal pattern 134 may be variously changed depending on the method used to form the first and second metal patterns.

Referring to FIG. 6, a portion of the second metal pattern 134 may have the second vertical thickness VT2 that is greater than the first vertical thickness VT1 (i.e., VT2>VT1) in some embodiments. The second vertical thickness VT2 of the second metal pattern 134 may be substantially equal to the vertical thickness VT of the gate electrodes GE (i.e., VT2=VT). In an outer region that is adjacent the separation pattern 140, the second metal pattern 134 may have a vertical thickness that decreases in a direction from the separation pattern 140 toward the vertical channel VC. In an inner region that is adjacent the vertical channel VC, the second metal pattern 134 may have a substantially uniform vertical thickness VT1.

The first metal pattern 132 may be spaced apart from the spacer 143 and may be in contact with the insulating layer 121. The second metal pattern 134 may contact the insulating layer 121 and the spacer 143.

Referring to FIG. 7, in other embodiments, the second metal pattern 134 may have a second vertical thickness VT2 that is substantially equal to the first vertical thickness VT1 (i.e., VT2=VT1). The vertical thickness of the second metal pattern 134 may be substantially uniform in an outer region that is adjacent the separation pattern 140, and the vertical thickness of the second metal pattern 134 may be substantially uniform in an inner region that is adjacent the vertical channel VC.

The first metal pattern 132 may contact the spacer 143 and the insulating layer 121. The second metal pattern 134 may contact the spacer 143 and may not contact the insulating layer 121.

Referring to FIG. 8, in still other embodiments, the second metal pattern 134 may have a first portion with a substantially uniform first vertical thickness VT1 and a second portion with a substantially uniform second vertical thickness VT2, where VT2 is greater than VT1. The second vertical thickness VT2 may be substantially equal to the vertical thickness VT of the gate electrodes GE (i.e., VT2=VT). The second portion of the second metal pattern 134 that has the second vertical thickness is an outer region that is adjacent the separation pattern 140. The first portion of the second metal pattern 134 that has the first thickness is an inner region that is adjacent the vertical channel VC The first metal pattern 132 may be spaced apart from the spacer 143 and may contact the insulating layer 121. The second metal pattern 134 may contact the insulating layer 121 and the spacer 143.

Referring to FIG. 9, in still other embodiments, the second metal pattern 134 may have a first portion having a first vertical thickness VT1 and a second portion that has a second vertical thickness VT2 that is greater than the first vertical thickness VT1 and that is smaller than the vertical thickness VT of the gate electrodes GE (i.e., VT1<VT2<VT). In an outer region that is adjacent the separation pattern 140, the vertical thickness of the second metal pattern 134 may decrease in a direction from the separation pattern 140 toward the vertical channel VC, and in an inner region that is adjacent the vertical channel VC, the vertical thickness of the second metal pattern 134 may be substantially uniform.

The first metal pattern 132 may contact the spacer 143 and the insulating layer 121, and the second metal pattern 134 may be spaced apart from the insulating layer 121 and may contact the spacer 143.

Figure 19:
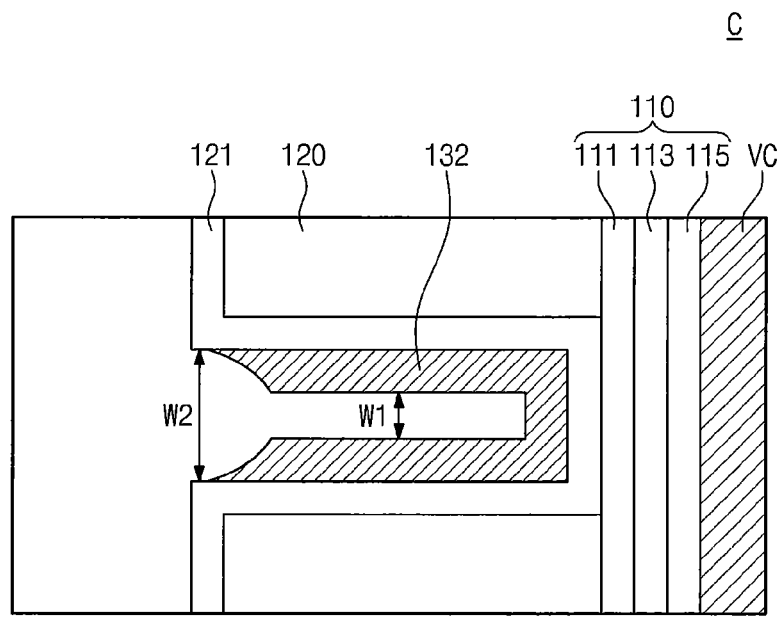
FIGS. 19 and 20 are enlarged views of a portion 'C' of FIG. 18.
Figure 20:
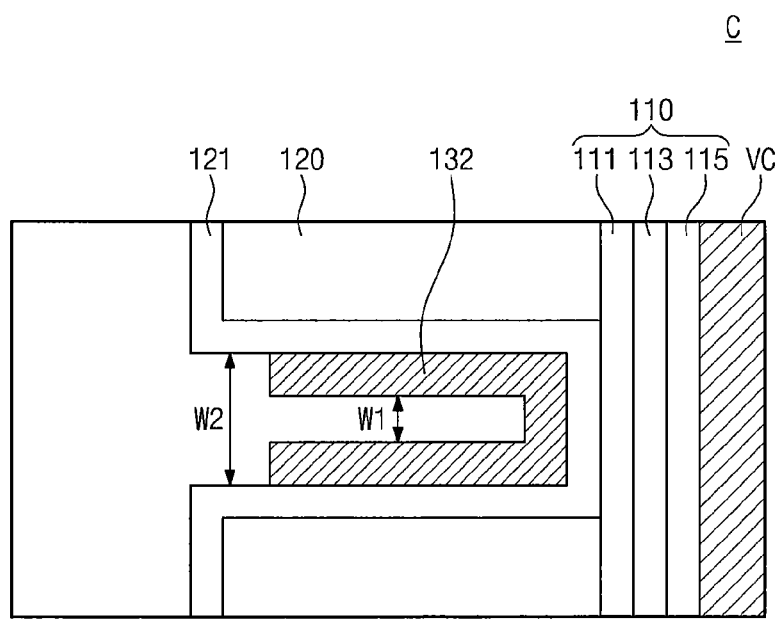

FIGS. 10 to 18 and 21 to 23 are sectional views, which are taken along line I-I' of FIG. 2 to illustrate a method of fabricating a semiconductor memory device, according to some embodiments of the inventive concepts. FIGS. 19 and 20 are enlarged views of a portion 'C' of FIG. 18.

Figure 10:
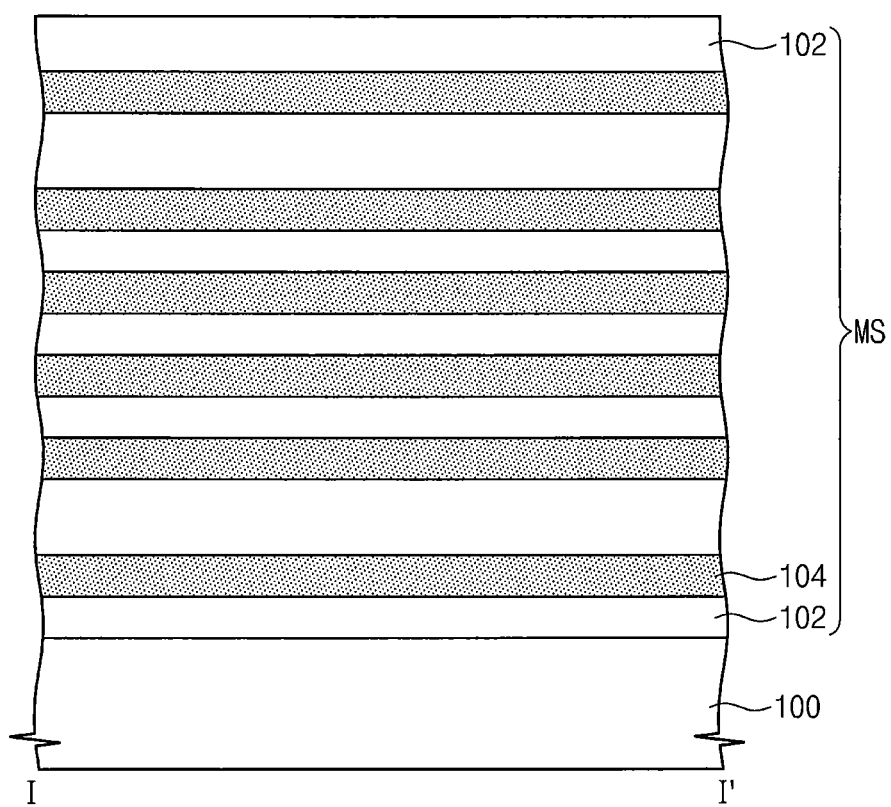
FIGS. 10 to 18 and 21 to 23 are sectional views, which are taken along line I-I' of FIG. 2, that illustrate a method of fabricating a semiconductor memory device according to some embodiments of the inventive concepts.

Referring to FIG. 10, a mold structure MS may be formed on the substrate 100. The substrate 100 may comprise, for example, a silicon substrate, a silicon-germanium substrate, a germanium substrate, or a single-crystalline epitaxial layer grown on a single-crystalline silicon substrate.

The mold structure MS may include insulating layers 102 and sacrificial layers 104, which are alternatingly and repeatedly stacked on the substrate 100. The insulating layers 102 may include a material that has a lower etch rate than a material used to form the sacrificial layers 104, in a subsequent etching process for removing the sacrificial layers 104. For example, the insulating layers 102 may include silicon oxide, and the sacrificial layers 104 may include silicon nitride or silicon oxynitride, and the subsequent etching process may use an etchant that will remove silicon nitride and/or silicon oxynitride while substantially not etching silicon oxide. The insulating layers 102 may be formed of the same material, and the sacrificial layers 104 may also be formed of the same material. Although not illustrated in the drawings, a buffer insulating layer may be provided between the substrate 100 and the mold structure MS.

Figure 11:
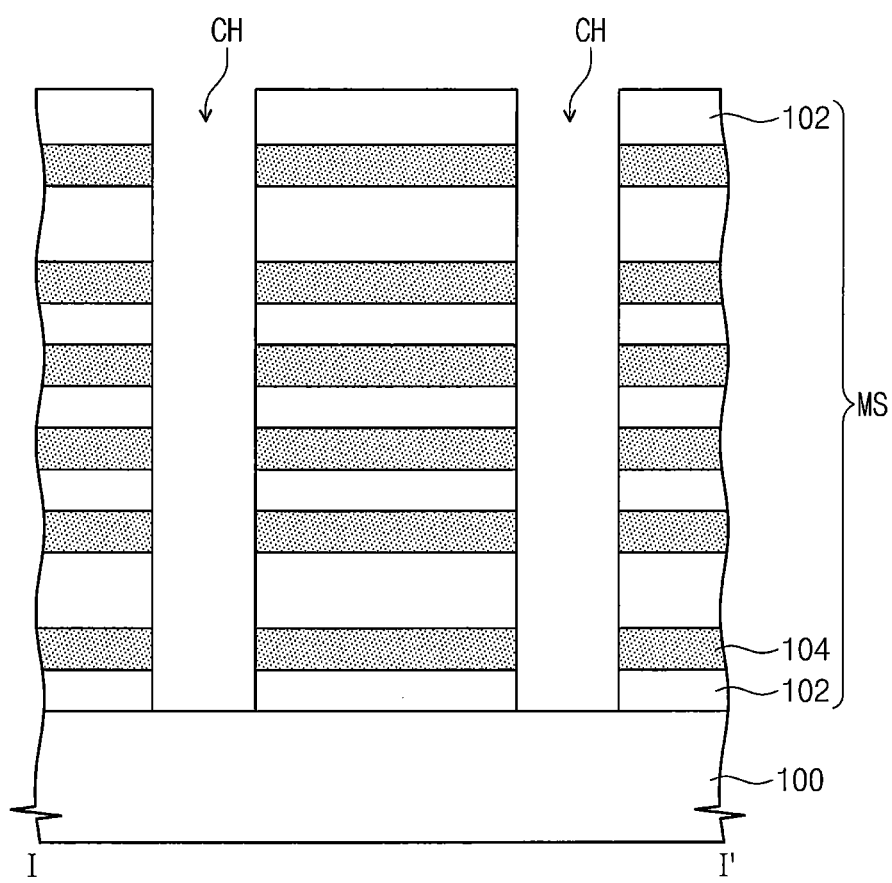

Referring to FIG. 11, the mold structure MS may be etched to form a channel hole CH. The channel hole CH may expose the substrate 100. For example, a mask pattern (not shown) may be formed on the uppermost one of the insulating layers 102, and then, the mold structure MS may be anisotropically etched using the mask pattern as an etch mask. In some embodiments, the channel hole CH may have a constant width, independent of a distance from the substrate 100. In other embodiments, the channel hole CH may have a width that varies with the distance from the substrate 100. For example, the channel hole CH may have a side surface that is inclined with respect to the substrate 100 in some embodiments. The etching process may be performed in an over-etch manner so that the top surface of the substrate 100 is partially recessed. The channel hole CH may have, for example, a circular, elliptical, or polygonal shape, when viewed in a plan view.

Figure 12:
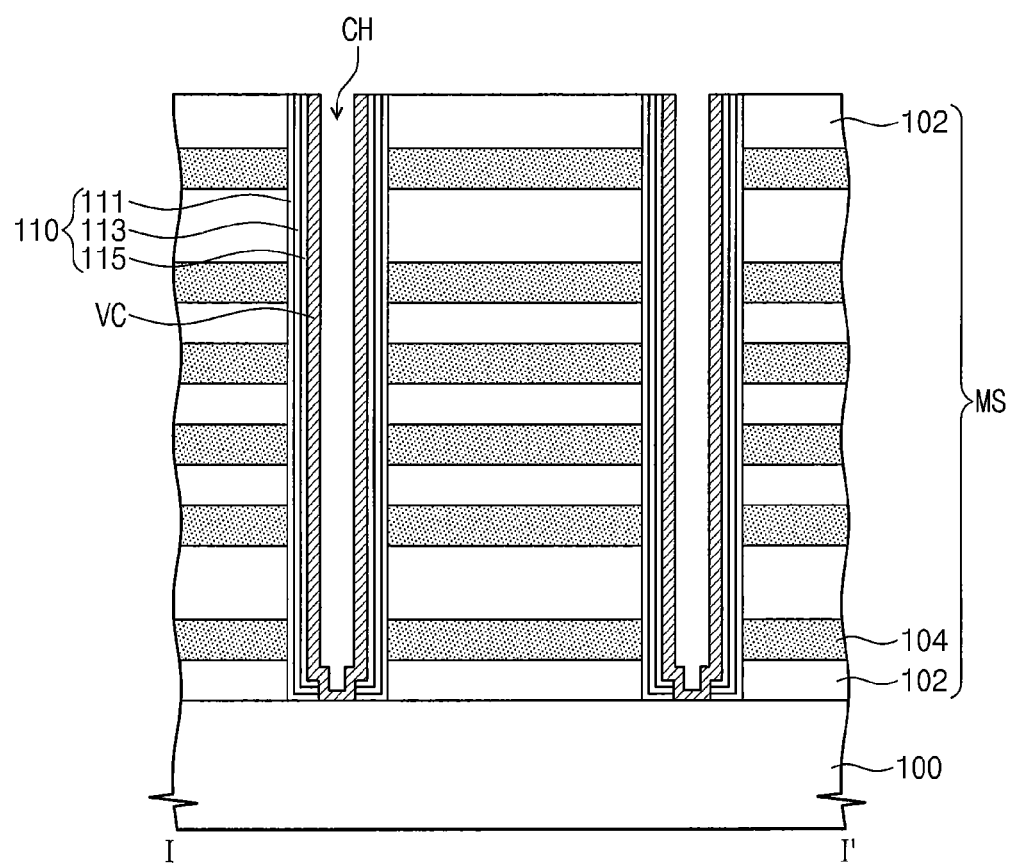

Referring to FIG. 12, the charge storing structure 110 may be formed on a sidewall of the channel hole CH. The charge storing structure 110 may cover not only the sidewalls of the channel hole CH but also a portion of the top surface of the substrate 100 that is exposed by the channel hole CH. The charge storing structure 110 may be formed by sequentially forming a first insulating layer, a second insulating layer, and a third insulating layer to cover the side surface of the channel hole CH and then etching the first through third insulating layers using a dry etching process to partially expose the top surface of the substrate 100.

The charge storing structure 110 may include the blocking insulating layer 111, the charge storing layer 113, and the tunnel insulating layer 115, which are sequentially formed on the sidewall of the channel hole CH. The blocking insulating layer 111 may include at least one of silicon oxide or high-k dielectric materials (e.g., $Al_2O_3$ or $HfO_2$), the charge storing layer 113 may include silicon nitride, and the tunnel insulating layer 115 may include at least one of silicon oxynitride or high-k dielectric materials (e.g., $Al_2O_3$ or $HfO_2$).

The vertical channel VC may be formed in the channel hole CH on the charge storing structure 110. The vertical channel VC may conformally cover the side surface of the tunnel insulating layer 115 and the top surface of the substrate 100. The vertical channel VC may include a semiconductor material. For example, the vertical channel VC may include at least one of a polysilicon layer, an organic semiconductor layer, or a carbon nano structure.

In some embodiments, a semiconductor pillar SP may be formed in the channel hole CH before the charge storing structure 110 is formed, as shown in FIG. 5. The semiconductor pillar SP may be grown from the substrate 100 by a selective epitaxial growth process, in which the portion of the substrate 100 exposed by the channel hole CH is used as a seed layer. The semiconductor pillars SP may include, for example, an intrinsic semiconductor material or a p-type semiconductor material.

Figure 13:
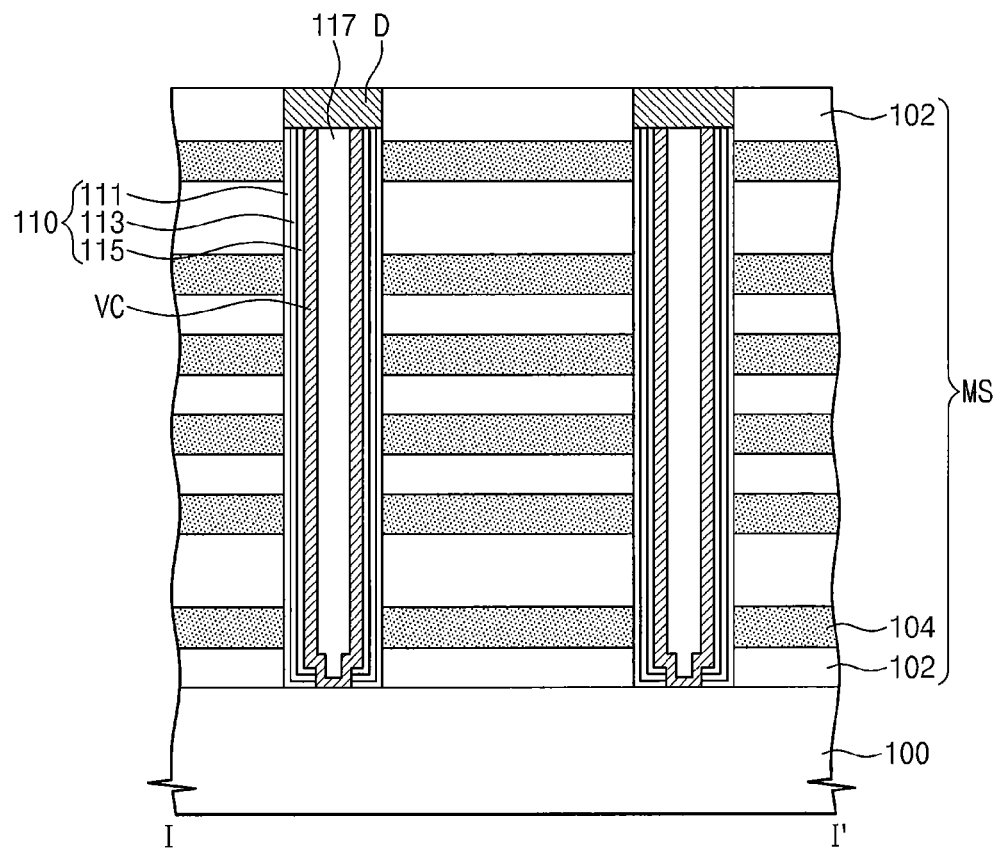

Referring to FIG. 13, the capping layer 117 may be formed in the channel hole CH on the vertical channel VC. The capping layer 117 may completely fill the channel hole CH. The capping layer 117 may be formed using a spin-on-glass (SOG) technique. The capping layer 117 may include an insulating material (e.g., silicon oxide and silicon nitride). Before forming the capping layer 117, the vertical channel VC may be treated by a hydrogen annealing process (e.g., by a thermal treatment process that is performed under an ambient containing hydrogen or deuterium gas). Crystal defects in the vertical channel VC may be reduced or eliminated by the hydrogen annealing process.

The pads D may be formed on the charge storing structure 110, the vertical channel VC, and the capping layer 117. The pads D may be formed by etching upper portions of the charge storing structure 110, the vertical channel VC, and the capping layer 117 to form recess regions, and then, filling the recess regions with a conductive material. In certain embodiments, the pads D may be formed by injecting dopants, whose conductivity type is different from that of the vertical channel VC, into the upper portions of the vertical channels VC.

Figure 14:
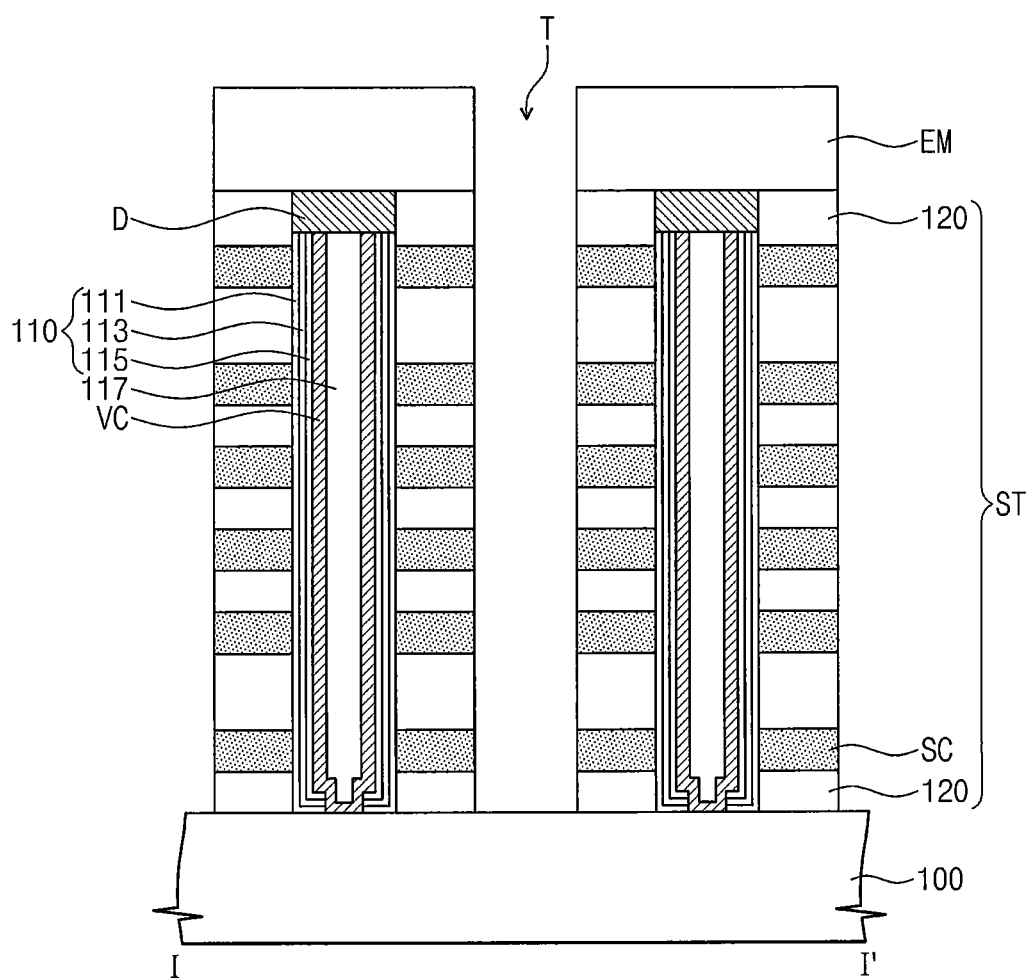

Referring to FIG. 14, the mold structure MS may be anisotropically etched to form trenches T. The trenches T may be formed by forming a mask pattern EM on the mold structure MS and anisotropically etching the mold structure MS using the mask pattern EM as an etch mask to expose the top surface of the substrate 100. The trenches T may extend in the second direction Y or across the first direction X, as shown in FIG. 2. For example, when viewed in a plan view, each of the trenches T may have a linear or rectangular shape elongated in the second direction Y. As a result of the formation of the trenches T, a plurality of the stacks ST may be formed that are spaced apart from each other in the first direction X on the substrate 100.

Each of the stacks ST may include the insulating patterns 120 and sacrificial patterns SC, which are sequentially and alternately stacked on the substrate 100. The insulating patterns 120 may be formed by patterning the insulating layers 102, and the sacrificial patterns SC may be formed by pattering the sacrificial layers 104. The sidewalls of the stacks ST may be exposed through the trenches T.

Figure 15:
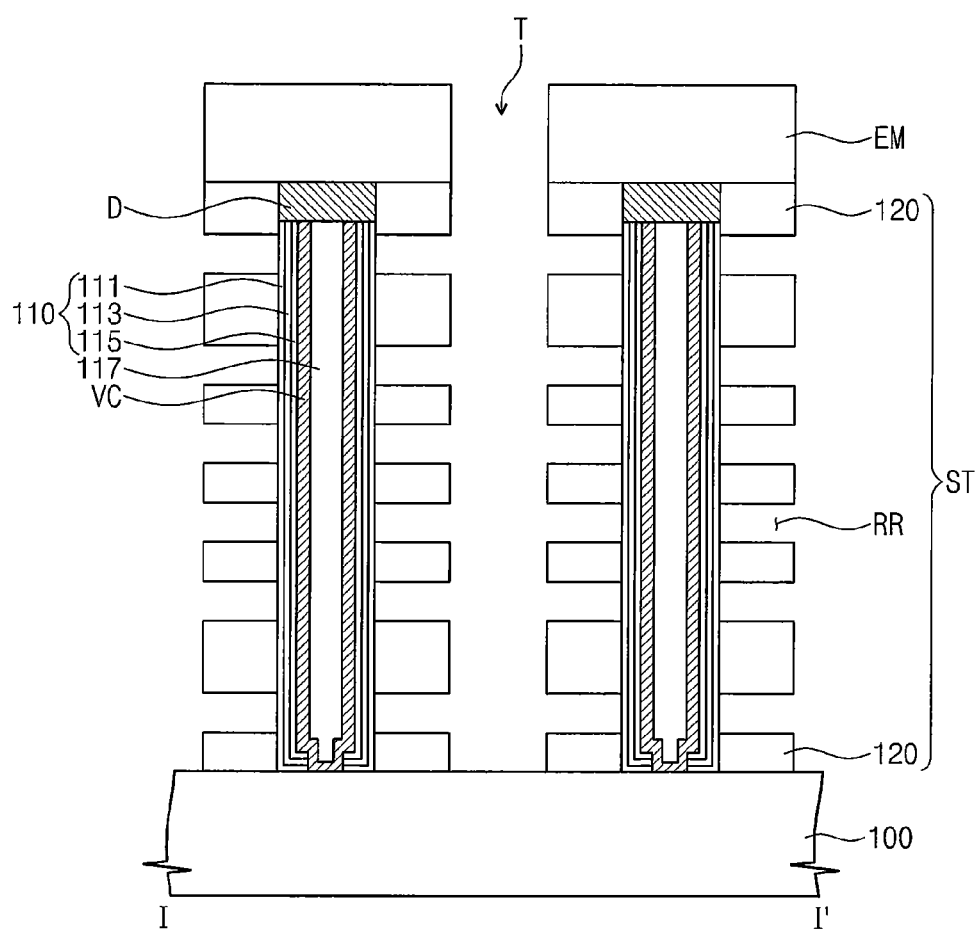

Referring to FIG. 15, the sacrificial patterns SC exposed by the trenches T may be removed to form recess regions RR between the insulating patterns 120. The recess regions RR may be formed by performing a wet etching process and/or an isotropic dry etching process on the sacrificial patterns SC. In the case where the insulating patterns 120 have an etch selectivity with respect to the sacrificial patterns SC, the insulating patterns 120 will remain after the sacrificial patterns SC are removed. For example, in the case where the sacrificial patterns SC are formed of silicon nitride and the insulating patterns 120 are formed of silicon oxide, the etching process may be performed using an etching solution containing phosphoric acid.

The recess regions RR may extend laterally from the trenches T to expose top and bottom surfaces of the insulating patterns 120. The recess regions RR may also expose portions of the blocking insulating layer 111 that are positioned between the insulating patterns 120.

Figure 16:
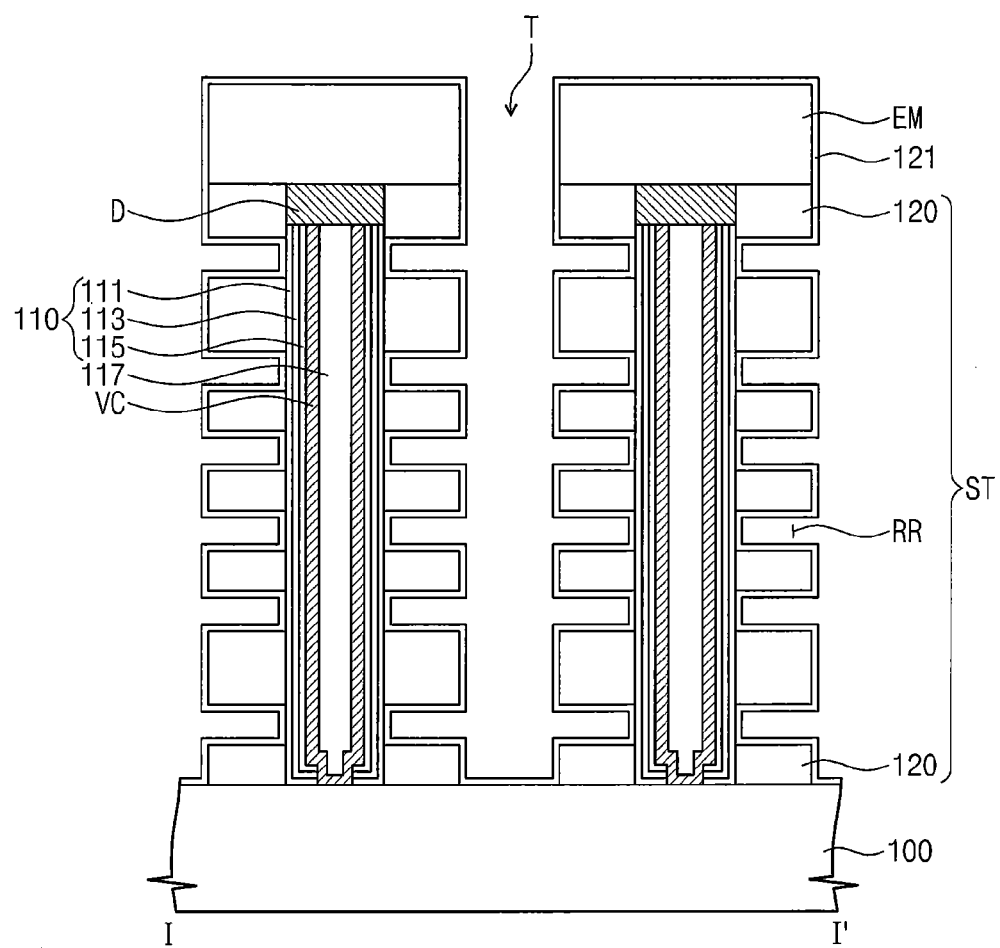

Referring to FIG. 16, an insulating layer 121 may be formed to conformally cover the resulting structure with the recess regions RR and the trenches T. For example, the insulating layer 121 may conformally cover the exposed surfaces of the insulating patterns 120, the blocking insulating layer 111, the substrate 100, and the mask patterns EM. The insulating layer 121 may be formed using a deposition process with a good step coverage property. For example, the insulating layer 121 may be formed using a chemical vapor deposition (CVD) or an atomic layer deposition (ALD) process.

The insulating layer 121 may be used as a part of a blocking insulating layer of a charge-trapping-type nonvolatile memory transistor. The insulating layer 121 may include at least one of silicon oxide ($SiO_2$) or high-k dielectric materials (e.g., aluminum oxide ($Al_2O_3$) or hafnium oxide ($HfO_2$)).

Figure 17:
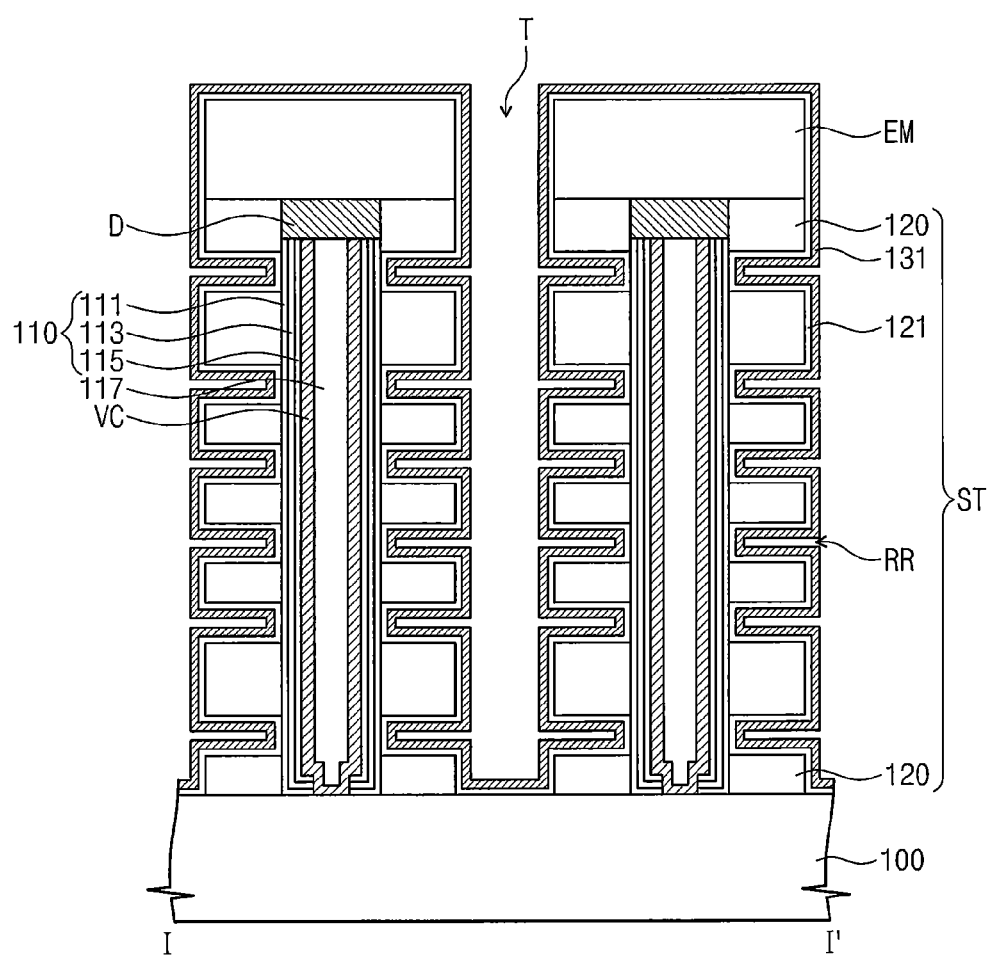

Referring to FIG. 17, a first metal layer 131 may be formed in the recess regions RR. In some embodiments, the first metal layer 131 may conformally cover the insulating layer 121. The first metal layer 131 may have a thickness that is smaller than half a vertical thickness of the recess region RR. In this case, the first metal layer 131 will only partially fill the recess regions RR.

In some embodiments, a tungsten-containing nucleation layer with crystalline nuclei may be used as the first metal layer 131. The first metal layer 131 may be formed using a chemical vapor deposition (CVD) or an atomic layer deposition (ALD) process. In this case, the deposition process for forming the first metal layer 131 may be performed using a sacrificial gas (e.g., $B_2H_6$, $SiH_4$, or $Si_2H_6$) and a tungsten-containing precursor (e.g., $WF_6$, $WCl_6$, or organic tungsten source materials).

Figure 18:
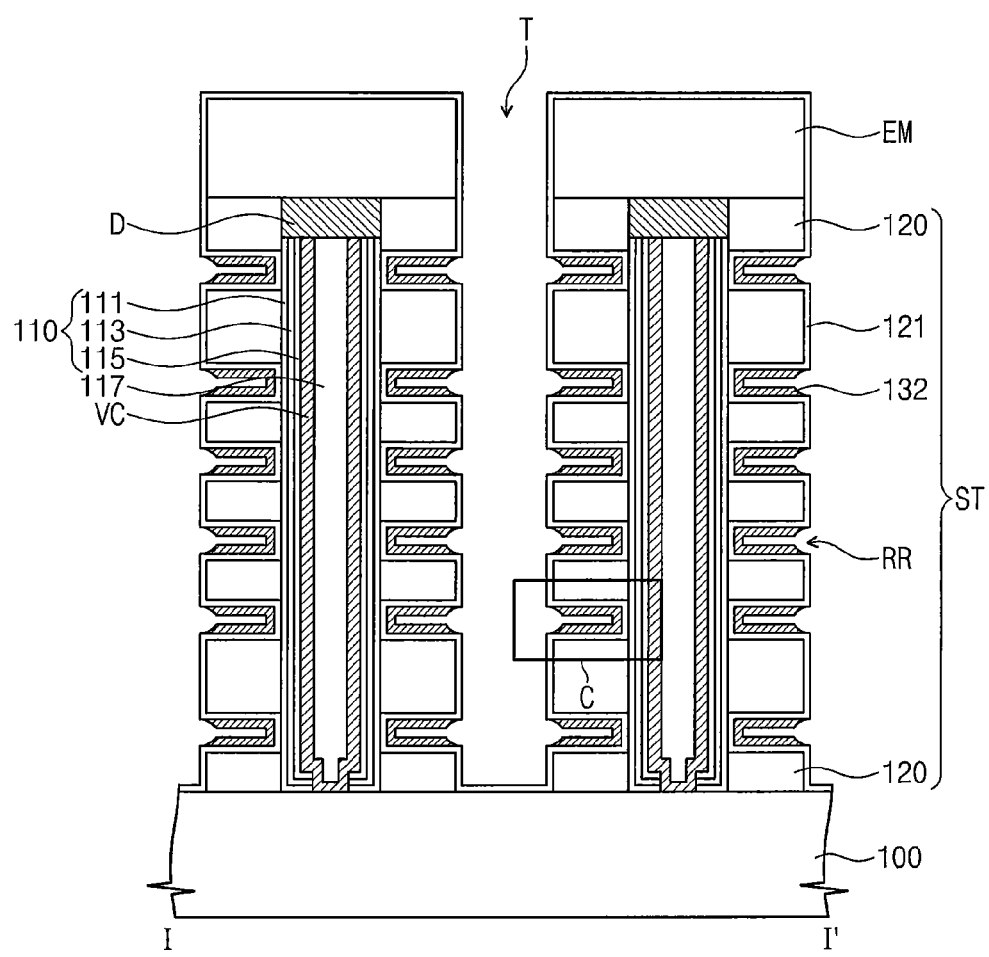

Referring to FIG. 18, an etching process may be performed to etch portions of the first metal layer 131, which are positioned near the trench T (or near entrances of the recess regions RR), and as a result, first metal patterns 132 may be formed in the respective recess regions RR. The etching process may be performed using at least one of a dry etching process (e.g., etch back process, ashing process, or strip process) and a wet etching process (e.g., cleaning process). For example, the dry etching process may be performed using an etching gas containing at least one of $N_2$, $H_2$, Cl, F, or S. The wet etching process may be performed using an etching solution, such as standard clean 1 (SC1)-containing solution, HF-containing solution, LAL solution containing a mixture of $H_2O$, HF, and $NH_4F$, or a phosphoric acid solution.

The etching process may etch portions of the first metal layer 131 that are positioned near corners of the insulating patterns 120 and adjacent the trench T. Accordingly, a vertical length W2 of the recess region RR that is adjacent the trench T may be greater than a vertical length W1 of the recess region RR that is adjacent the vertical channel VC (i.e., W1<W2), as shown in FIGS. 19 and 20.

Referring to FIGS. 19 and 20, portions of the first metal layer 131 that are near the outer corners of the insulating patterns 120 may be removed to expose the insulating layer 121. For example, the first metal pattern 132 may be formed in the recess region RR to partially expose the top and bottom surfaces of the insulating layer 121 that defines the recess region RR. The etching process may also remove the first metal layer 131 from the sidewall of the trench T and thereby expose the insulating layer 121.

The final shape of the first metal pattern 132 may be changed, depending on the etching method used.

For example, in the case where the first metal layer 131 is etched using an isotropic etching method, the first metal pattern 132 may have a concave etching profile, as shown in FIG. 19. In other words, the recess region RR may have a vertical length that decreases in a direction from the trench T toward the vertical channel VC.

Alternatively, in the case where the first metal layer 131 is etched using at least one of an isotropic or an anisotropic etching method, the first metal pattern 132 may have a surface, whose profile is substantially perpendicular to the top or bottom surface of the insulating layer 121, as shown in FIG. 20. In other words, a portion of the recess region RR near the trench T may have a uniform vertical length.

Figure 21:
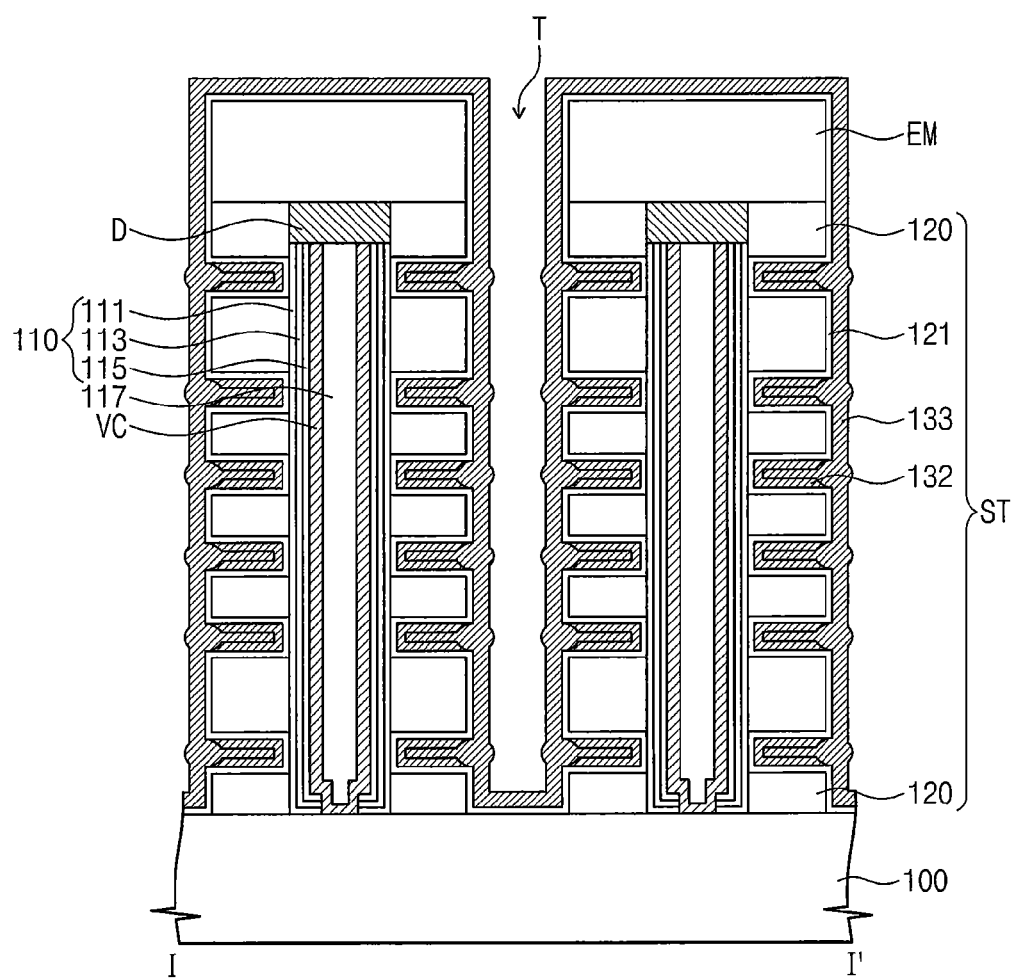

Referring to FIG. 21, the recess regions RR having the first metal patterns 132 therein may be filled with a second metal layer 133. The second metal layer 133 may be formed by a chemical vapor deposition (CVD) or atomic layer deposition (ALD) process. In this case, the second metal layer 133 may be deposited using a sacrificial gas (e.g., $B_2H_6$, $SiH_4$, or $Si_2H_6$) and a tungsten-containing precursor (e.g., $WF_6$, $WCl_6$, or organic tungsten source materials). In some embodiments, the second metal layer 133 may be a tungsten-containing bulk layer. The second metal layer 133 may have a grain size different from that of the first metal pattern 132.

The second metal layer 133 may be grown from surfaces of the first metal patterns 132 to fill the recess regions RR. Accordingly, the second metal layer 133 may include two portions, which are respectively grown from the top and bottom surfaces of the first metal pattern 132 in the recess regions RR to form an interface therebetween, as shown in FIGS. 6 through 9.

According to some embodiments of the inventive concepts, the vertical length of an inner region of the recess region RR may be smaller than a vertical length of an outer region of the recess region RR, and thus, an amount of the second metal layer 133 needed to fill the inner region of the recess region RR may be less than that needed for fill the outer region of the recess region RR. As a result, the inner region of the recess region RR may be filled with the second metal layer 133, before the outer region of the recess region RR. For example, the filling of the second metal layer 133 may progress in a direction from the inner region toward the outer region of the recess region RR. As a result, the second metal layer 133 may fill the recess region RR, without formation of any slit or void.

Before forming the second metal layer 133, an annealing process may be performed on the first metal patterns 132. By performing the annealing process, it is possible to relieve or reduce stress or crystal defects in a metal crystalline structure of the first metal pattern 132. The annealing process may lead to an increase in grain size of the first metal pattern 132. In some embodiments, the annealing process may be performed at a temperature of, for example, about 750-1050° C., allowing the first metal patterns 132 (e.g., tungsten patterns) to have an increased grain size. As a result of such an annealing process, the first metal patterns 132 may have a grain size larger than that of the second metal layer 133.

Figure 22:
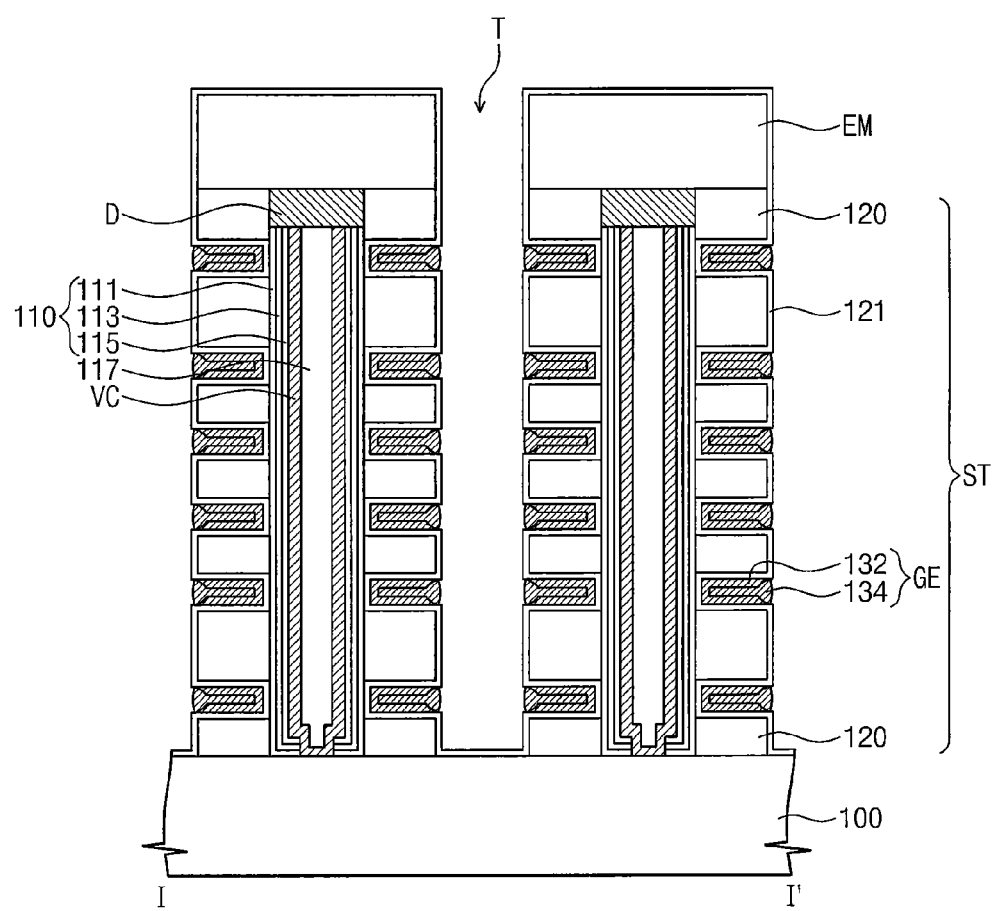

Referring to FIG. 22, portions of the second metal layer 133 may be removed from the trench T to form the second metal patterns 134 in the recess regions RR. The first metal patterns 132 and the second metal patterns 134 may form the gate electrodes GE of the semiconductor memory device. The etching of the second metal layer 133 may be performed using at least one of isotropic or anisotropic etching process.

In some embodiments, as a result of the etching process on the first metal layer 131, the first metal patterns 132 may have the vertical thickness VT2 at a region that is adjacent the separation pattern 140 and have the vertical thickness VT1, which is smaller than the vertical thickness VT2, at a region that is adjacent the vertical channel VC (e.g., VT1<VT2), as shown in FIGS. 6 and 7.

After the formation of the second metal patterns 134, the impurity regions CSR may be formed in portions of the substrate 100 exposed by the trenches T. In some embodiments, the impurity regions CSR may be formed by an ion implantation process. The impurity regions CSR may have a conductivity type different from that of the substrate 100.

Figure 23:
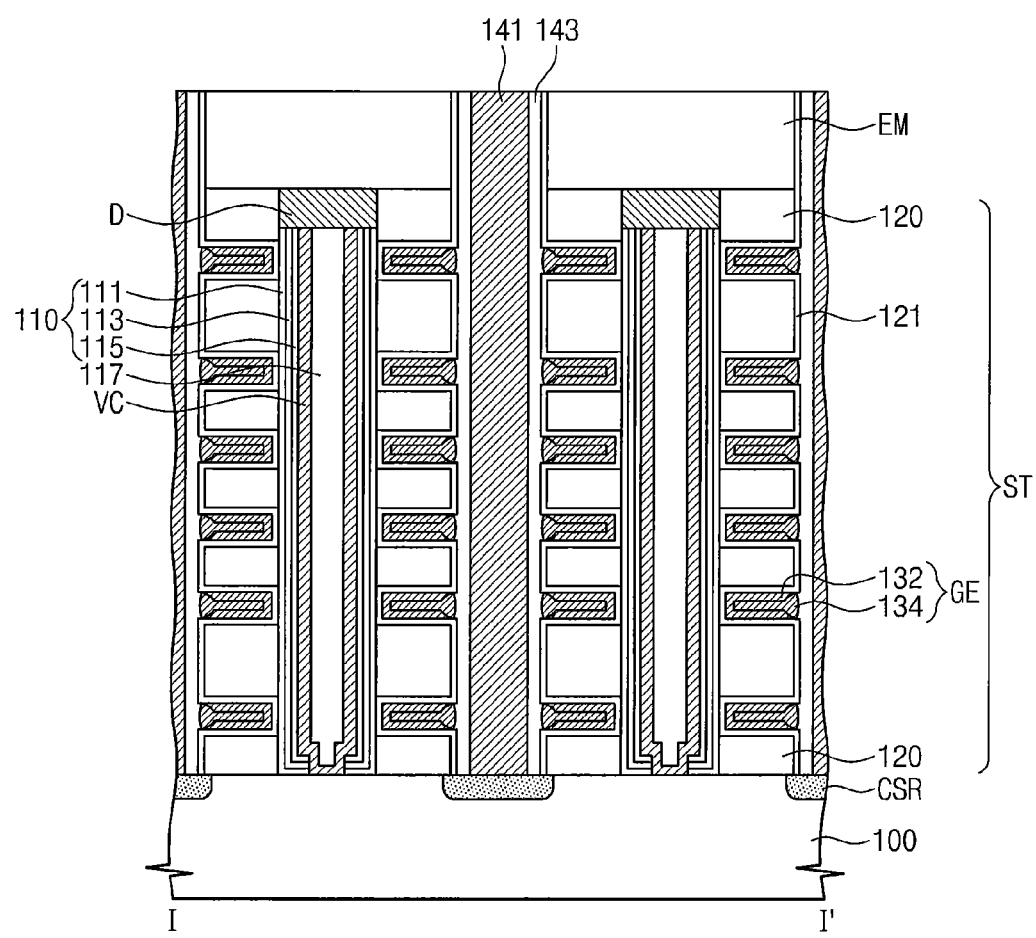

Referring to FIG. 23, the spacers 143 may cover the sidewalls of the stacks ST exposed by the trenches T, and the common source contacts 141 may fill the trenches T. For example, the spacers 143 may be formed by forming an insulating layer (not shown) to cover the side and bottom surfaces of the trenches T and then removing the insulating layer from the bottom surfaces of the trenches T to expose the top surface of the substrate 100. In some embodiments, the spacers 143 may comprise silicon oxide or silicon nitride. The common source contacts 141 may fill the trenches T provided with the spacers 143. The common source contact 141 may be formed by, for example, a chemical vapor deposition (CVD) process, a physical vapor deposition (PVD) process, or an atomic layer deposition (ALD) process. The common source contacts 141 may include at least one of metals (e.g., tungsten, copper, or aluminum) or transition metals (e.g., titanium or tantalum).

Referring back to FIGS. 2 through 5, the interlayered insulating layer 150 may be formed on the mask patterns EM. The interlayered insulating layer 150 may cover top surfaces of the mask patterns EM, the spacer 143 and the common source contact 141. The interlayered insulating layer 150 may include at least one of insulating materials (e.g., silicon oxide, silicon nitride, or silicon oxynitride).

The contact plugs CP may be formed by etching the interlayered insulating layer 150 and the mask patterns EM to form a hole (not shown), and then, filling the hole with a conductive material. The contact plug CP may be electrically connected to the pad D. The contact plug CP may include at least one of doped silicon or conductive materials (e.g., tungsten (W), copper (Cu), or aluminum (Al)).

The bit lines BL may be formed on the interlayered insulating layer 150 to contact the contact plug CP. Each of the bit lines BL may cross the stacks ST and may be connected to a plurality of the vertical channels VC arranged in the first direction X. The bit lines BL may include a conductive material (e.g., tungsten (W)).

Figure 24:
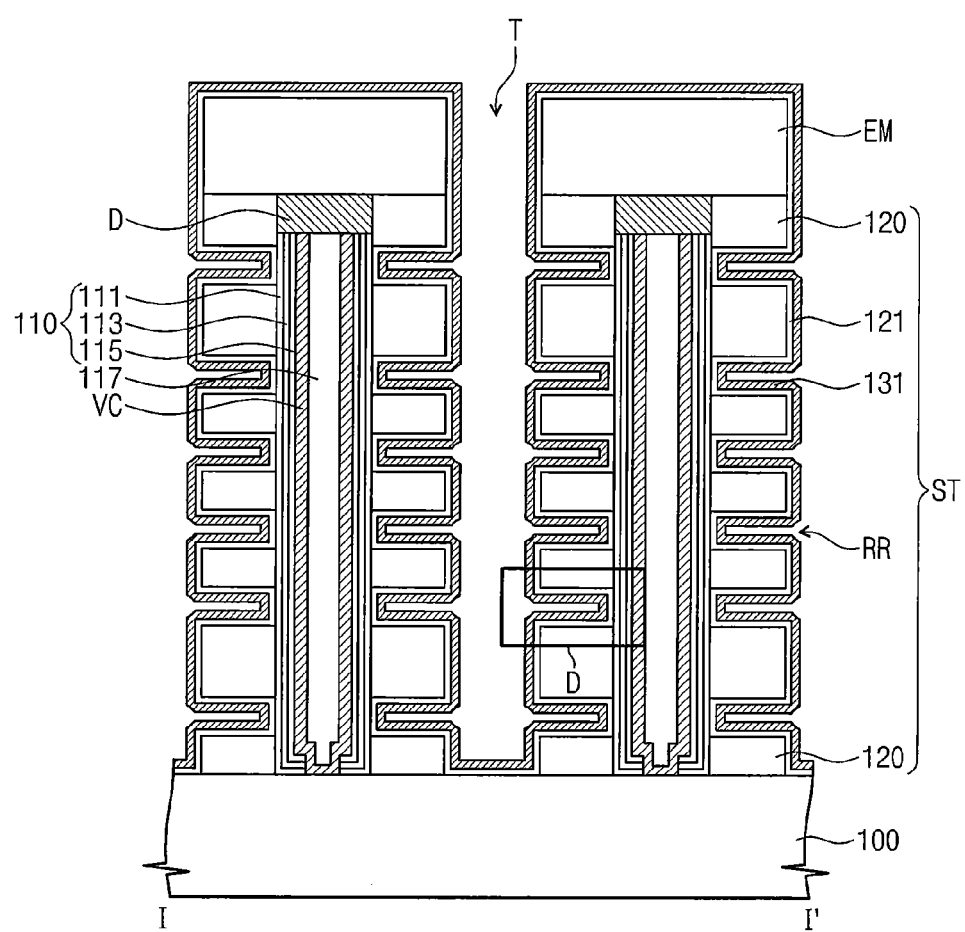
FIGS. 24, 27, and 28 are sectional views, which are taken along line I-I' of FIG. 2, that illustrate a method of fabricating a semiconductor memory device according to some embodiments of the inventive concepts.
Figure 25:
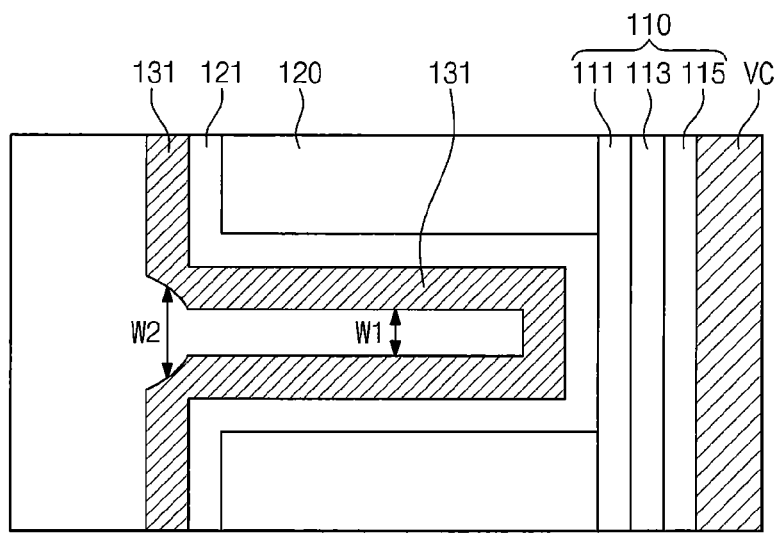
FIGS. 25 and 26 are enlarged views of a portion 'D' of FIG. 24.
Figure 26:
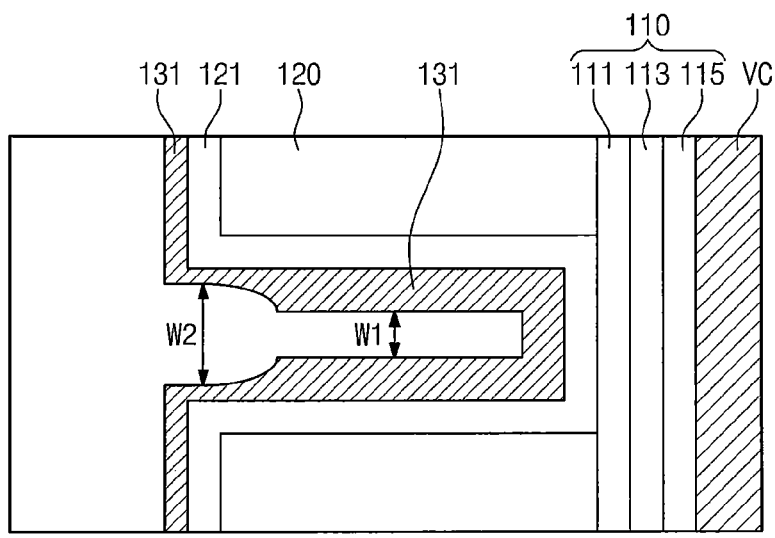
Figure 27:
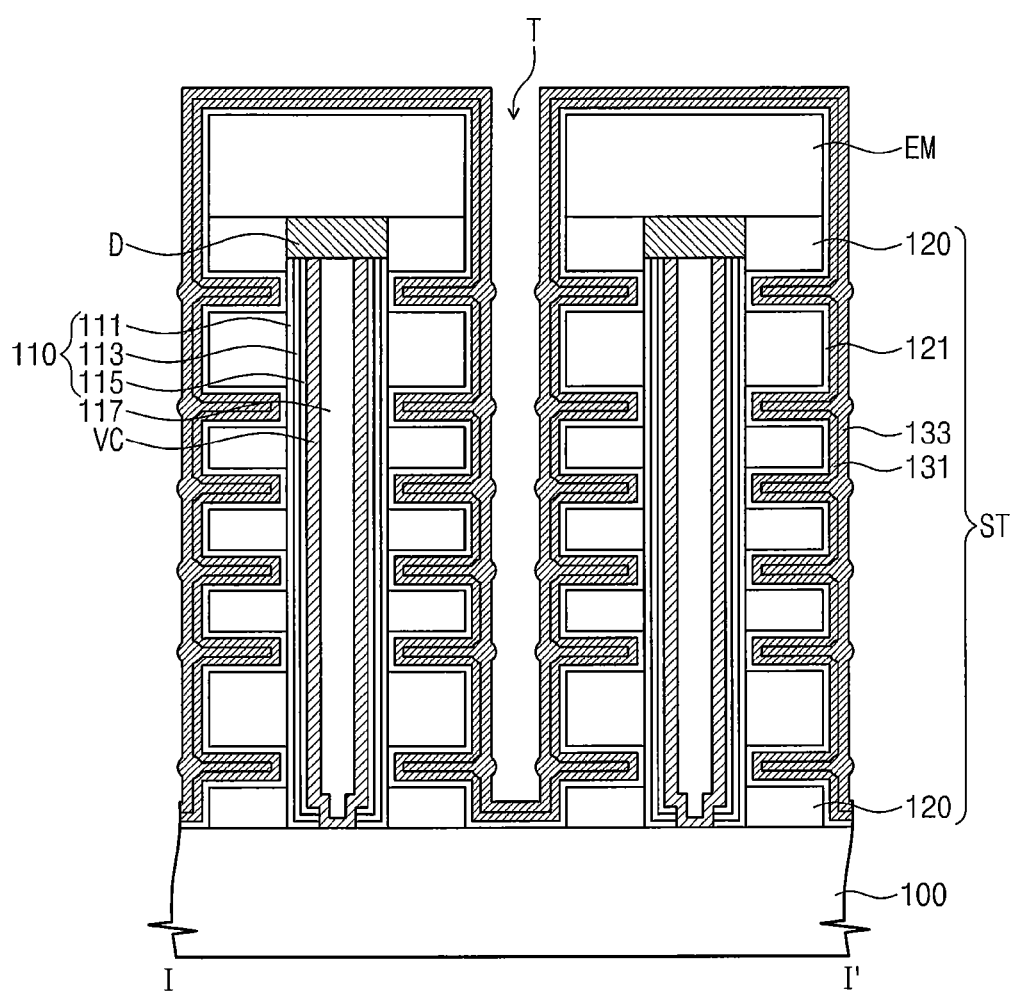
Figure 28:
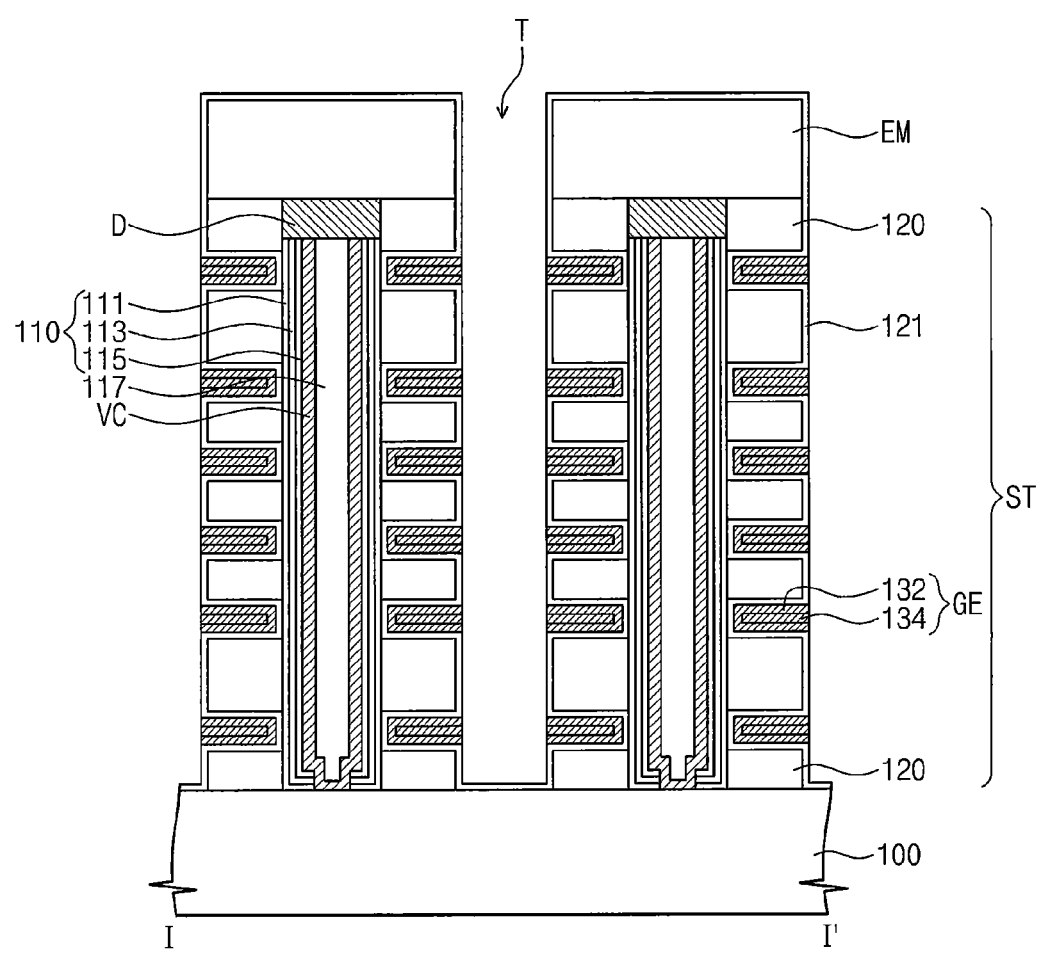

FIGS. 24, 27, and 28 are sectional views, which are taken along line I-I' of FIG. 2 to illustrate a method of fabricating a semiconductor memory device according to some embodiments of the inventive concepts. FIGS. 25 and 26 are enlarged views of a portion 'D' of FIG. 24. For concise description, a previously described element may be identified by a similar or identical reference number without repeating an overlapping description thereof.

Referring to FIG. 24, an etching process may be performed to etch the first metal layer 131 near the corners of the insulating patterns 120. Accordingly, a vertical length of the recess region RR that is adjacent the trench T may be greater than a vertical length of the recess region RR that is adjacent the vertical channel VC (i.e., W2>W1). The etching may be performed in such a way that the first metal layer 131 may remain on the sidewall of the trench T.

For example, as shown in FIG. 25, the first metal layer 131 may be etched to allow each of the recess regions RR that are adjacent the trench T to be filled with the second metal layer 133 in a subsequent process. For example, the first metal layer 131 may be etched in such a way that the recess regions RR have a vertical length, allowing the recess regions RR provided with the first metal layer 131 to be filled with the second metal layer 133. For example, the etching process may locally etch the corners of the first metal layer 131 that are adjacent the trench T. In this case, portions of the first metal layer 131 in the recess regions RR may not be etched by the etching process.

Referring to FIG. 26, in further embodiments, an etching process may be performed on portions of the first metal layer 131 that are adjacent the trench T and in the recess regions RR. Here, the first metal layer 131 may be etched to prevent the insulating layer 121 in the recess regions RR from being exposed. In some embodiments, the first metal layer 131 may be etched to have a concave etching profile, as shown in FIG. 26. Alternatively, although not illustrated in the drawings, the first metal layer 131 may be etched to have a flat etching profile.

Referring to FIG. 27, the second metal layer 133 may be formed in the recess regions RR on the first metal layer 131. The second metal layer 133 may be configured to have substantially the same features as that of FIG. 21, and a detailed description thereof will be omitted.

Referring to FIG. 28, the first and second metal layers 131 and 133 that are exposed by the trenches T may be removed to form the first metal patterns 132 and the second metal patterns 134 in the recess regions RR. The process of etching the first metal layer 131 may be performed in the same manner as described with reference to FIG. 25, and thus, each first metal pattern 132 may have a uniform vertical thickness, as shown in FIG. 7. By etching the first metal layer 131 in the same manner as described with reference to FIG. 26, the first metal pattern 132 may have the vertical thickness VT2 at the outer region that is adjacent the separation pattern 140 and the vertical thickness VT1, which is greater than the vertical thickness VT2, at the inner region that is adjacent the vertical channel VC (i.e., VT2>VT1), as shown in FIG. 9.

The subsequent process may be performed in the same manner as described with reference to FIG. 23 and FIGS. 2 through 5, and a detailed description thereof will be omitted.

According to some embodiments of the inventive concepts, a method of fabricating a semiconductor memory device may include forming gate electrodes, each of which includes first and second metal patterns. The first and second metal patterns may be formed by first and second deposition steps, respectively. The use of the two deposition steps may make it possible to fill a recess region with the gate electrode, without formation of a void. In other words, the gate electrode can be formed to have a void-free structure, and thus, it is possible to reduce or prevent the blocking insulating layer from being damaged by a deposition gas remaining in a void. This may improve reliability of the semiconductor memory device.

While some embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
stacks on a substrate, each of the stacks comprising a plurality of gate electrodes stacked on the substrate and insulating patterns interposed between the gate electrodes;
a vertical channel connected to the substrate; and
a separation pattern disposed between the stacks,
wherein each of the gate electrodes comprises:
a first metal pattern disposed between the insulating patterns to define a recess region recessed toward the vertical channel; and
a second metal pattern disposed in the recess region, and
wherein the first and second metal patterns contain the same metallic material and have mean grain sizes different from each other.

2. The semiconductor memory device of claim 1, wherein a first mean grain size of the metallic material in the first metal patterns is greater than a second mean grain size of the metallic material in the second metal patterns.

3. The semiconductor memory device of claim 1, wherein the second metal patterns have a first vertical thickness at a region that is adjacent the vertical channel and a second vertical thickness at another region that is adjacent the separation pattern, and
the first vertical thickness is substantially the same as the second vertical thickness.

4. The semiconductor memory device of claim 1, wherein the second metal patterns have a first vertical thickness at a region that is adjacent the vertical channel and a second vertical thickness at another region that is adjacent the separation pattern, and
the second vertical thickness is greater than the first vertical thickness.

5. The semiconductor memory device of claim 4, wherein the second vertical thickness of the second metal patterns is smaller than a vertical thickness of the gate electrodes.

6. The semiconductor memory device of claim 4, wherein the second vertical thickness of the second metal patterns is substantially the same as a vertical thickness of the gate electrodes.

7. The semiconductor memory device of claim 1, wherein the second metal patterns has a vertical thickness that decreases in a direction from the separation pattern toward the vertical channel.

8. The semiconductor memory device of claim 1, further comprising an insulating layer which is disposed between the vertical channel and each of the first metal patterns and which covers top and bottom surfaces of the respective first metal patterns,
wherein the second metal patterns are between the separation pattern and the respective first metal patterns and are in contact with the insulating layer.

9. The semiconductor memory device of claim 1, wherein a portion of the second metal patterns that is adjacent the separation pattern has a vertical length that decreases in a direction from the separation pattern toward the vertical channel, and another portion of the second metal patterns that is adjacent the vertical channel has a substantially uniform vertical length.

10. The semiconductor memory device of claim 1, wherein each of the first and second metal patterns contains tungsten.

11. A semiconductor memory device, comprising:
stacks on a substrate, each of the stacks comprising a plurality of gate electrodes stacked on the substrate and insulating patterns interposed between the gate electrodes;
a vertical channel connected to the substrate; and
a separation pattern disposed between the stacks,
wherein each of the gate electrodes comprises:
a first metal pattern disposed between the insulating patterns to define a recess region recessed toward the vertical channel; and
a second metal pattern disposed in the recess region, the second metal pattern having a first vertical thickness at a region that is adjacent the vertical channel and a second vertical thickness at another region that is adjacent the separation pattern,
wherein the second vertical thickness is greater than the first vertical thickness.

12. The semiconductor memory device of claim 11, wherein the second metal pattern has a vertical thickness that decreases in a direction from the separation pattern toward the vertical channel.

13. The semiconductor memory device of claim 11, wherein the second vertical thickness of the second metal patterns is substantially the same as a vertical thickness of the gate electrodes.

14. The semiconductor memory device of claim 11, wherein the second vertical thickness of the second metal patterns is smaller than a vertical thickness of the gate electrodes.

15. The semiconductor memory device of claim 11, wherein the first and second metal patterns contain the same metal material, and
the first metal patterns have a first mean grain size that is larger than a second mean grain size of the second metal patterns.

16. A semiconductor memory device, comprising:
a plurality of gate electrodes that are vertically stacked on a substrate, each gate electrode including a first metal pattern and a second metal pattern that fills a recess region defined by the first metal pattern,
wherein the first and second metal patterns comprise the same material but have different mean grain sizes.

17. The semiconductor memory device of claim 16, further comprising an insulating layer, a separation pattern and a vertical channel, wherein the gate electrodes are disposed between the separation pattern and the vertical channel, the insulating layer is between each gate electrode and the vertical channel, and the insulating layer further covers top and bottom surfaces of each of the gate electrodes.

18. The semiconductor memory device of claim 17, wherein portions of the second metal patterns that are adjacent the vertical channel have a first vertical thickness and portions of the second metal patterns that are adjacent the separation pattern have a second vertical thickness, the second vertical thickness being greater than the first vertical thickness.

19. The semiconductor memory device of claim 16, wherein each first metal pattern is generally U-shaped and each second metal pattern fills an interior of the respective one of the generally U-shaped first metal patterns.

20. The semiconductor memory device of claim 17, wherein the separation pattern directly contacts each first metal pattern and each second metal pattern.

* * * * *